(12) United States Patent
Yan et al.

(10) Patent No.: US 12,027,410 B2
(45) Date of Patent: *Jul. 2, 2024

(54) EDGE RING ARRANGEMENT WITH MOVEABLE EDGE RINGS

(71) Applicant: LAM RESEARCH CORPORATION, Fremont, CA (US)

(72) Inventors: Haoquan Yan, Fremont, CA (US); Robert Griffith O'Neill, Hayward, CA (US); Raphael Casaes, Alameda, CA (US); Jon Mcchesney, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 200 days.

This patent is subject to a terminal disclaimer.

(21) Appl. No.: 17/181,571

(22) Filed: Feb. 22, 2021

(65) Prior Publication Data

US 2021/0183687 A1 Jun. 17, 2021

Related U.S. Application Data

(63) Continuation of application No. 16/131,822, filed on Sep. 14, 2018, now abandoned, which is a (Continued)

(51) Int. Cl.
*H01L 21/687* (2006.01)
*H01J 37/02* (2006.01)
(Continued)

(52) U.S. Cl.
CPC ...... *H01L 21/68742* (2013.01); *H01J 37/023* (2013.01); *H01J 37/20* (2013.01);
(Continued)

(58) Field of Classification Search
None
See application file for complete search history.

(56) References Cited

U.S. PATENT DOCUMENTS

| 3,534,753 A | 10/1970 | Ollivier |
| 4,262,686 A | 4/1981 | Heim et al. |

(Continued)

FOREIGN PATENT DOCUMENTS

| CN | 1189859 A | 8/1998 |
| CN | 1701421 A | 11/2005 |

(Continued)

OTHER PUBLICATIONS

U.S. Appl. No. 15/427,163, filed Feb. 8, 2017, Kwame Eason et al.

(Continued)

*Primary Examiner* — Keath T Chen
*Assistant Examiner* — Margaret Klunk

(57) ABSTRACT

An edge ring arrangement for a processing chamber includes a first ring configured to surround and overlap a radially outer edge of an upper plate of a pedestal arranged in the processing chamber, a second ring arranged below the first moveable ring, wherein a portion of the first ring overlaps the second ring, a first actuator configured to actuate a first pillar to selectively move the first ring to a raised position and a lowered position relative to the pedestal, and a second actuator configured to actuate a second pillar to selectively move the second ring to a raised position and a lowered position relative to the pedestal.

18 Claims, 18 Drawing Sheets

Related U.S. Application Data continuation of application No. 14/705,430, filed on May 6, 2015, now Pat. No. 10,658,222, which is a continuation-in-part of application No. 14/598,943, filed on Jan. 16, 2015, now Pat. No. 11,605,546.

(51) Int. Cl.
  *H01J 37/20* (2006.01)
  *H01J 37/32* (2006.01)
  *H01L 21/67* (2006.01)

(52) U.S. Cl.
  CPC .. *H01J 37/32623* (2013.01); *H01J 37/32642* (2013.01); *H01J 37/32715* (2013.01); *H01L 21/67069* (2013.01); *H01L 21/68735* (2013.01)

(56) References Cited

U.S. PATENT DOCUMENTS

| | | | |
|---|---|---|---|
| 4,374,698 | A | 2/1983 | Sanders et al. |
| 4,431,477 | A | 2/1984 | Zajac |
| 4,793,897 | A | 12/1988 | Dunfield et al. |
| 5,190,823 | A | 3/1993 | Anthony et al. |
| 5,220,515 | A | 6/1993 | Freerks et al. |
| 5,304,248 | A * | 4/1994 | Cheng ............... C23C 16/04 118/728 |
| 5,329,965 | A | 7/1994 | Gordon |
| 5,346,578 | A | 9/1994 | Benzing et al. |
| 5,376,214 | A | 12/1994 | Iwasaki et al. |
| 5,413,145 | A | 5/1995 | Rhyne et al. |
| 5,520,969 | A | 5/1996 | Nishizato et al. |
| 5,569,350 | A * | 10/1996 | Osada ............... H01L 21/6831 118/728 |
| 5,605,179 | A | 2/1997 | Strong, Jr. et al. |
| 5,660,673 | A | 8/1997 | Miyoshi |
| 5,662,143 | A | 9/1997 | Caughran |
| 5,683,517 | A | 11/1997 | Shan |
| 5,702,530 | A | 12/1997 | Shan et al. |
| 5,744,695 | A | 4/1998 | Forbes |
| 5,762,714 | A | 6/1998 | Mohn et al. |
| 5,792,272 | A | 8/1998 | van Os et al. |
| 5,840,129 | A | 11/1998 | Saenz et al. |
| 5,851,299 | A | 12/1998 | Cheng et al. |
| 5,886,863 | A | 3/1999 | Nagasaki et al. |
| 5,907,221 | A | 5/1999 | Sato et al. |
| 5,952,060 | A | 9/1999 | Ravi |
| 6,022,809 | A | 2/2000 | Fan |
| 6,042,687 | A | 3/2000 | Singh et al. |
| 6,044,534 | A | 4/2000 | Seo et al. |
| 6,048,403 | A | 4/2000 | Deaton et al. |
| 6,050,283 | A | 4/2000 | Hoffman et al. |
| 6,060,400 | A | 5/2000 | Oehrlein et al. |
| 6,062,256 | A | 5/2000 | Miller et al. |
| 6,074,959 | A | 6/2000 | Wang et al. |
| 6,152,168 | A | 11/2000 | Ohmi et al. |
| 6,206,976 | B1 | 3/2001 | Crevasse et al. |
| 6,210,593 | B1 | 4/2001 | Ohkuni et al. |
| 6,217,937 | B1 | 4/2001 | Shealy |
| 6,231,716 | B1 | 5/2001 | White et al. |
| 6,294,466 | B1 | 9/2001 | Chang |
| 6,328,808 | B1 | 12/2001 | Tsai et al. |
| 6,376,386 | B1 | 4/2002 | Oshima |
| 6,492,774 | B1 | 12/2002 | Han et al. |
| 6,508,911 | B1 | 1/2003 | Han et al. |
| 6,511,543 | B1 | 1/2003 | Stauss et al. |
| 6,589,352 | B1 * | 7/2003 | Yudovsky ........... C23C 16/4585 118/728 |
| 6,605,352 | B1 | 8/2003 | Windischmann |
| 6,623,597 | B1 | 9/2003 | Han et al. |
| 6,709,547 | B1 | 3/2004 | Ni et al. |
| 6,722,642 | B1 | 4/2004 | Sutton et al. |
| 6,736,931 | B2 | 5/2004 | Collins et al. |
| 6,744,212 | B2 | 6/2004 | Fischer et al. |
| 6,818,560 | B1 | 11/2004 | Koshimizu et al. |
| 6,841,943 | B2 | 1/2005 | Vahedi et al. |
| 6,896,765 | B2 | 5/2005 | Steger |
| 6,898,558 | B2 | 5/2005 | Klekotka |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,311,784 | B2 | 12/2007 | Fink |
| 7,338,907 | B2 | 3/2008 | Li et al. |
| 7,378,128 | B2 | 5/2008 | Rancoule |
| 7,431,788 | B2 | 10/2008 | Ricci et al. |
| 7,481,944 | B2 | 1/2009 | Nozawa et al. |
| 7,736,998 | B2 | 6/2010 | Morita et al. |
| 7,757,541 | B1 | 7/2010 | Monkowski et al. |
| 7,758,698 | B2 | 7/2010 | Bang et al. |
| 7,882,800 | B2 | 2/2011 | Koshiishi et al. |
| 7,968,469 | B2 | 6/2011 | Collins et al. |
| 7,988,813 | B2 | 8/2011 | Chen et al. |
| 8,137,463 | B2 | 3/2012 | Liu et al. |
| 8,177,910 | B2 | 5/2012 | Schmid et al. |
| 8,291,935 | B1 | 10/2012 | Merritt et al. |
| 8,485,128 | B2 | 7/2013 | Kellogg et al. |
| 8,552,334 | B2 | 10/2013 | Tappan et al. |
| 8,555,920 | B2 | 10/2013 | Hirata et al. |
| 8,592,328 | B2 | 11/2013 | Hausmann et al. |
| 8,826,855 | B2 | 9/2014 | Kellogg et al. |
| 8,889,024 | B2 | 11/2014 | Watanabe et al. |
| 8,956,980 | B1 | 2/2015 | Chen et al. |
| 8,999,106 | B2 | 4/2015 | Liu et al. |
| 9,011,637 | B2 | 4/2015 | Yamamoto |
| 9,051,647 | B2 | 6/2015 | Cooperberg et al. |
| 9,059,678 | B2 | 6/2015 | Long et al. |
| 9,142,391 | B2 | 9/2015 | Yamamoto |
| 9,318,343 | B2 | 4/2016 | Ranjan et al. |
| 9,412,555 | B2 | 8/2016 | Augustino et al. |
| 9,471,065 | B2 | 10/2016 | Koyomogi et al. |
| 9,640,409 | B1 | 5/2017 | Yang et al. |
| 9,779,916 | B2 | 10/2017 | Dhindsa et al. |
| 10,096,471 | B2 | 10/2018 | Canniff |
| 10,410,832 | B2 | 9/2019 | Zhang et al. |
| 10,490,392 | B2 | 11/2019 | Ishizawa |
| 10,504,738 | B2 | 12/2019 | Lin et al. |
| 10,510,516 | B2 | 12/2019 | Lin et al. |
| 10,591,934 | B2 | 3/2020 | Gopalakrishnan et al. |
| 10,651,015 | B2 | 5/2020 | Angelov et al. |
| 10,658,222 | B2 | 5/2020 | Yan et al. |
| 10,699,878 | B2 | 6/2020 | Caron et al. |
| 2001/0002581 | A1 | 6/2001 | Nishikawa et al. |
| 2001/0004903 | A1 | 6/2001 | Ohmi et al. |
| 2001/0013363 | A1 | 8/2001 | Kitayama et al. |
| 2001/0035530 | A1 | 11/2001 | Udagawa |
| 2002/0038669 | A1 | 4/2002 | Yamagishi et al. |
| 2002/0042205 | A1 | 4/2002 | McMillin et al. |
| 2002/0043337 | A1 | 4/2002 | Goodman et al. |
| 2002/0046991 | A1 | 4/2002 | Smith et al. |
| 2002/0048536 | A1 | 4/2002 | Bergh et al. |
| 2002/0067585 | A1 | 6/2002 | Fujiwara |
| 2002/0071128 | A1 | 6/2002 | Doan |
| 2002/0072240 | A1 | 6/2002 | Koike |
| 2002/0088542 | A1 | 7/2002 | Nishikawa et al. |
| 2002/0160125 | A1 | 10/2002 | Johnson et al. |
| 2002/0174905 | A1 | 11/2002 | Latino et al. |
| 2002/0175144 | A1 | 11/2002 | Hung et al. |
| 2003/0000369 | A1 | 1/2003 | Funaki |
| 2003/0003696 | A1 | 1/2003 | Gelatos et al. |
| 2003/0011619 | A1 | 1/2003 | Jacobs et al. |
| 2003/0013080 | A1 | 1/2003 | Luebke et al. |
| 2003/0015141 | A1 | 1/2003 | Takagi |
| 2003/0021356 | A1 | 1/2003 | Okuda et al. |
| 2003/0023023 | A1 | 1/2003 | Harris et al. |
| 2003/0116195 | A1 | 6/2003 | Weissgerber et al. |
| 2003/0130807 | A1 | 7/2003 | Ambrosina et al. |
| 2003/0186563 | A1 | 10/2003 | Kobayashi et al. |
| 2003/0196890 | A1 | 10/2003 | Le et al. |
| 2003/0201069 | A1 | 10/2003 | Johnson |
| 2003/0213560 | A1 | 11/2003 | Wang et al. |
| 2003/0230239 | A1 | 12/2003 | Shan |
| 2003/0231950 | A1 | 12/2003 | Raaijmakers |
| 2003/0236592 | A1 | 12/2003 | Shajii et al. |

(56) References Cited

U.S. PATENT DOCUMENTS

| | | |
|---|---|---|
| 2003/0236638 A1 | 12/2003 | Shajii et al. |
| 2003/0236643 A1 | 12/2003 | Shajii et al. |
| 2004/0007176 A1 | 1/2004 | Janakiraman et al. |
| 2004/0025060 A1 | 2/2004 | Raffaele et al. |
| 2004/0026149 A1 | 2/2004 | Wilkinson |
| 2004/0031338 A1 | 2/2004 | Chen et al. |
| 2004/0053428 A1 | 3/2004 | Steger |
| 2004/0060595 A1 | 4/2004 | Chittenden |
| 2004/0089240 A1 | 5/2004 | Dando et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0061447 A1 | 3/2005 | Kim et al. |
| 2005/0067021 A1 | 3/2005 | Bevers et al. |
| 2005/0082007 A1 | 4/2005 | Nguyen et al. |
| 2005/0155625 A1 | 7/2005 | Jangjian et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0060141 A1 | 3/2006 | Kamaishi et al. |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2006/0283551 A1 | 12/2006 | Son |
| 2007/0024077 A1 | 2/2007 | McClintock |
| 2007/0026684 A1 | 2/2007 | Parascandola et al. |
| 2007/0066038 A1 | 3/2007 | Sadjadi et al. |
| 2007/0131350 A1 | 6/2007 | Ricci et al. |
| 2007/0158025 A1 | 7/2007 | Larson |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0208427 A1 | 9/2007 | Davidson et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0264840 A1* | 11/2007 | Itatani ............... C23C 16/4412 438/758 |
| 2007/0283882 A1 | 12/2007 | Cho et al. |
| 2007/0284344 A1 | 12/2007 | Todorov et al. |
| 2008/0014347 A1 | 1/2008 | Power |
| 2008/0072823 A1 | 3/2008 | Yudovsky et al. |
| 2008/0101978 A1 | 5/2008 | Ryabova et al. |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0174387 A1 | 7/2008 | Chiang |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2008/0317564 A1 | 12/2008 | Cheng et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1* | 3/2009 | Lanee ............... H01L 21/68721 414/172 |
| 2009/0078196 A1 | 3/2009 | Midorikawa |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0163037 A1 | 6/2009 | Miya et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1* | 8/2009 | Koelmel ........... H01L 21/68735 438/795 |
| 2009/0221117 A1 | 9/2009 | Tan et al. |
| 2009/0236313 A1 | 9/2009 | Qiu et al. |
| 2009/0272717 A1 | 11/2009 | Pamarthy et al. |
| 2009/0279989 A1 | 11/2009 | Wong et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0071438 A1 | 3/2010 | Davis et al. |
| 2010/0108261 A1 | 5/2010 | Augustino et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0197070 A1 | 8/2010 | Stoddard et al. |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1* | 2/2011 | Kobayashi ........ H01J 37/32623 204/298.36 |
| 2011/0094596 A1 | 4/2011 | Sugiyama et al. |
| 2011/0108524 A1 | 5/2011 | Dhindsa et al. |
| 2011/0126984 A1 | 6/2011 | Kang et al. |
| 2011/0135821 A1 | 6/2011 | Ding |
| 2011/0157760 A1 | 6/2011 | Willwerth et al. |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1* | 11/2011 | Yamamoto ........ H01L 21/68742 438/758 |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0175063 A1* | 7/2012 | Yamawaku ........ H01L 21/67069 156/345.46 |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0247671 A1* | 10/2012 | Sugawara ......... H01L 21/68742 156/345.31 |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |

(56) References Cited

U.S. PATENT DOCUMENTS

| | | |
|---|---|---|
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0135058 A1 | 5/2013 | Long et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0313785 A1 | 11/2013 | Otschik et al. |
| 2013/0334038 A1 | 12/2013 | Riker et al. |
| 2014/0017900 A1 | 1/2014 | Doba et al. |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1* | 8/2014 | McMillin ......... H01J 37/32642 438/716 |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0111258 A1 | 4/2016 | Taskar et al. |
| 2016/0172165 A1 | 6/2016 | Jeon et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0043527 A1 | 2/2017 | Uttaro |
| 2017/0062769 A1 | 3/2017 | Kim et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0115657 A1 | 4/2017 | Trussell et al. |
| 2017/0200586 A1 | 7/2017 | Treadwell et al. |
| 2017/0213751 A1 | 7/2017 | Oohashi |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1 | 2/2018 | Zhang et al. |
| 2018/0114716 A1 | 4/2018 | Hao et al. |
| 2018/0138069 A1 | 5/2018 | Tan et al. |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |
| 2018/0358211 A1 | 12/2018 | Mun |
| 2019/0013232 A1 | 1/2019 | Yan et al. |
| 2019/0027988 A1 | 1/2019 | Filipenko et al. |
| 2019/0279888 A1 | 9/2019 | Gopalakrishnan et al. |
| 2019/0363003 A1 | 11/2019 | Sarode Vishwanath |
| 2020/0004954 A1 | 1/2020 | Zawadowskiy et al. |
| 2020/0020565 A1 | 1/2020 | Rathnasinghe et al. |
| 2020/0049547 A1 | 2/2020 | Spyropoulos et al. |
| 2020/0395195 A1 | 12/2020 | Sanchez et al. |
| 2021/0057256 A1 | 2/2021 | Bergantz et al. |
| 2021/0066052 A1 | 3/2021 | Emura |
| 2021/0111007 A1 | 4/2021 | Kim et al. |
| 2021/0291374 A1 | 9/2021 | Bergantz et al. |
| 2022/0122878 A1 | 4/2022 | Wu et al. |
| 2022/0246408 A1 | 8/2022 | Genetti et al. |

FOREIGN PATENT DOCUMENTS

| | | |
|---|---|---|
| CN | 101552182 A | 10/2009 |
| CN | 102243977 A | 11/2011 |
| CN | 102315150 A | 1/2012 |
| CN | 103730318 A | 4/2014 |
| CN | 104205321 A | 12/2014 |
| CN | 104299929 A | 1/2015 |
| CN | 104752141 A | 7/2015 |
| CN | 104851832 A | 8/2015 |
| CN | 105336561 A | 2/2016 |
| CN | 107093569 A | 8/2017 |
| CN | 107768275 A | 3/2018 |
| CN | 108369922 A | 8/2018 |
| CN | 112563108 A | 3/2021 |
| EP | 0424299 A2 | 4/1991 |
| EP | 0821404 A2 | 1/1998 |
| EP | 0838842 A2 | 4/1998 |
| EP | 0875979 A1 | 11/1998 |
| JP | H07221024 A | 8/1995 |
| JP | H10-280173 A | 10/1998 |
| JP | 20000124141 A | 4/2000 |
| JP | 2001-230239 A | 8/2001 |
| JP | 2001522142 A | 11/2001 |
| JP | 2002500439 A | 1/2002 |
| JP | 2002503765 A | 2/2002 |
| JP | 2002-176030 A | 6/2002 |
| JP | 2002-217171 A | 8/2002 |
| JP | 2002-231794 A | 8/2002 |
| JP | 2003-513434 A | 4/2003 |
| JP | 2004-266127 A | 9/2004 |

(56) References Cited

FOREIGN PATENT DOCUMENTS

| | | |
|---|---|---|
| JP | 2004296553 A | 10/2004 |
| JP | 2006173223 A | 6/2006 |
| JP | 2006186171 A | 7/2006 |
| JP | 2006-344701 A | 12/2006 |
| JP | 2007207808 A | 8/2007 |
| JP | 2007-234867 A | 9/2007 |
| JP | 2007321244 A | 12/2007 |
| JP | 2007535819 A | 12/2007 |
| JP | 2008027936 A | 2/2008 |
| JP | 2008-244274 A | 10/2008 |
| JP | 2008-251681 A | 10/2008 |
| JP | 2010034416 A | 2/2010 |
| JP | 2010267894 A | 11/2010 |
| JP | 2011-54933 A | 3/2011 |
| JP | 2011210853 A | 10/2011 |
| JP | 2012-049376 A | 3/2012 |
| JP | 2012507860 A | 3/2012 |
| JP | 2012-216614 A | 11/2012 |
| JP | 2013511847 A | 4/2013 |
| JP | 2013526063 A | 6/2013 |
| JP | 2013530516 A | 7/2013 |
| JP | 5767373 B2 | 8/2015 |
| JP | 2015201552 A | 11/2015 |
| JP | 2016046451 A | 4/2016 |
| JP | 2016-219820 A | 12/2016 |
| JP | 2017183701 A | 10/2017 |
| JP | 2018010992 A | 1/2018 |
| JP | 2018098239 A | 6/2018 |
| JP | 2018125519 A | 8/2018 |
| JP | 2019505088 A | 2/2019 |
| JP | 2020043137 A | 3/2020 |
| KR | 20020031417 A | 5/2002 |
| KR | 1020020031417 A | 5/2002 |
| KR | 20020071398 A | 9/2002 |
| KR | 20030065126 A | 8/2003 |
| KR | 20040050080 A | 6/2004 |
| KR | 20050008792 A | 1/2005 |
| KR | 2005-0038898 A | 4/2005 |
| KR | 20050038898 A | 4/2005 |
| KR | 100578129 B1 | 5/2006 |
| KR | 100783062 B1 | 12/2007 |
| KR | 100803858 B1 | 2/2008 |
| KR | 20080013552 A | 2/2008 |
| KR | 20080023569 A | 3/2008 |
| KR | 20090024075 A | 3/2009 |
| KR | 20090080520 A | 7/2009 |
| KR | 1020090080520 A | 7/2009 |
| KR | 2010-0105695 A | 9/2010 |
| KR | 20100123724 A | 11/2010 |
| KR | 2011-0125188 A | 11/2011 |
| KR | 2013-0124616 A | 11/2013 |
| KR | 20130124616 A | 11/2013 |
| KR | 2013137962 A * | 12/2013 |
| KR | 20130137962 A | 12/2013 |
| KR | 20140001540 A | 1/2014 |
| KR | 2014-0101870 A | 8/2014 |
| KR | 2014-0103872 A | 8/2014 |
| KR | 2014-0132542 A | 11/2014 |
| KR | 10-2016-0063412 A | 6/2016 |
| KR | 10-2016-0088820 A | 7/2016 |
| KR | 2017-0037526 A | 4/2017 |
| KR | 20170037526 A | 4/2017 |
| KR | 20180099776 A | 9/2018 |
| KR | 101927936 B1 | 12/2018 |
| KR | 20190026898 A | 3/2019 |
| KR | 101974420 B1 | 5/2019 |
| KR | 101974422 B1 | 5/2019 |
| TW | 506234 B | 10/2002 |
| TW | 200302035 A | 7/2003 |
| TW | 200520137 A | 6/2005 |
| TW | I267563 B | 12/2006 |
| TW | 201001588 A | 1/2010 |
| TW | 201207933 A | 2/2012 |
| TW | 201324653 A | 6/2013 |
| TW | 201347063 A | 11/2013 |
| TW | 201351532 A | 12/2013 |
| TW | 201426854 A | 7/2014 |
| TW | 201436089 A | 9/2014 |
| TW | 201447965 A | 12/2014 |
| TW | 201528310 A | 7/2015 |
| TW | 201601208 A | 1/2016 |
| TW | 201626427 A | 7/2016 |
| TW | 201817899 A | 5/2018 |
| WO | WO-0040776 A1 | 7/2000 |
| WO | WO-0113404 A1 | 2/2001 |
| WO | WO-2007008509 A2 | 1/2007 |
| WO | WO-2009086109 A2 | 7/2009 |
| WO | WO-2011051251 A1 | 5/2011 |
| WO | WO-2013108750 A1 | 7/2013 |
| WO | WO-2013123617 A1 | 8/2013 |
| WO | WO-2014068886 A1 | 5/2014 |
| WO | WO-2014163742 A1 | 10/2014 |
| WO | WO-2014209492 A1 | 12/2014 |
| WO | WO-2017131927 A1 | 8/2017 |
| WO | WO-2017155812 A1 | 9/2017 |
| WO | WO-2018010986 A1 | 1/2018 |
| WO | WO-2019103722 A1 | 5/2019 |
| WO | WO-2019143858 A1 | 7/2019 |
| WO | WO-2020-180656 A1 | 9/2020 |
| WO | WO-2021026110 A1 | 2/2021 |
| WO | WO-2021030184 A1 | 2/2021 |
| WO | WO-2021-167897 A1 | 8/2021 |
| WO | WO-2021-194470 A1 | 9/2021 |
| WO | WO-2022076227 A1 | 4/2022 |

OTHER PUBLICATIONS

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.

First Office Action dated Dec. 29, 2017 corresponding to Chinese Patent Application No. 201610032252.1, 12 pages.

First Office Action dated Aug. 2, 2018 corresponding to Chinese Patent Application No. 201710036188.9, 7 pages.

Bohr, Mark, "The New Era of Scaling in an SoC World" Intel Logic Technology Development; ISSCC; 2009; 66 Pages.

Dusa, Mircean et al., "Pitch Doubling Through Dual Patterning Lithography Challenges in Integration and Litho Budgets," Optical Microlithography XX, vol. 6520, 65200G, (2007); 10 pages.

U.S. Office Action dated Oct. 5, 2015 issued in U.S. Appl. No. 14/576,020 [LAMRP146].

Blain et al. (Jul./Aug. 1996) "Role of nitrogen in the downstream etching of silicon nitride," Journal of Vacuum Science & Technology A, 14(4):2151-2157.

Blain (Mar./ Apr. 1999) "Mechanism of nitrogen removal from silicon nitride by nitric oxide," Journal of Vacuum Science & Technology A, 17(2):665-667.

Kastenmeier et al. (Nov./Dec. 1999) "Highly selective etching of silicon nitride over silicon and silicon dioxide," J. Vac. Sci. Techno !. A, American Vacuum Society, 17 (6):3179-3184.

Kastenmeier et al. (Sep./Oct. 1996) "Chemical dry etching of silicon nitride and silicon dioxide using CF4/02/N2 gas mixtures," J. Vac. Sci. Technol. A14(5):2802-2813.

Oehrlein et al. (1996) "Study of plasma-surface interactions: chemical dry etching and high-density plasma etching," Plasma Sources Sci. Technol. 5:193-199.

Tajima et al. (2013) "Room-Temperature Si Etching in NO/F2 Gases and the Investigation of Surface Reaction Mechanisms," The Journal of Physical Chemistry C, 117:5118-5125.

Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4): D267-D272.

U.S. Final Office Action dated Feb. 26, 2016 issued in U.S. Appl. No. 14/576,020 [LAMRP146].

U.S. Office Action dated Sep. 23, 2016 issued in U.S. Appl. No. 14/576,020 [LAMRP146].

European Extended Search Report dated May 30, 2016 issued in EP 15 199 363.1 [LAMRP146EP].

(56) References Cited

OTHER PUBLICATIONS

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).
US PPA No. 62065497, entitled "Gas Supply Delivery Arrangement Including a Gas Splitter for Tunable Gas Flow Control," filed Oct. 17, 2014, in the names of Mark Taskar et al. (Year: 2014).
First Chinese Office Action for Chinese Application No. 201710013856.6 dated Oct. 21, 2019.
First Chinese Office Action for Chinese Application No. CN201710076420.1 dated Dec. 17, 2019. No translation provided. 11 pages.
First Office Action corresponding to Japanese Application No. 2018-186353, dated Jan. 21, 2020, 8 pages.
First Office Action corresponding to Japanese Application No. 2016-004302, dated Jan. 28, 2020, 4 pages.
First Office Action corresponding to Tiawanese Application No. 106104190, dated Sep. 4, 2020, 5 pages.
Office Action issued in corresponding Japanese Patent Application 2016-143886 dated Sep. 8, 2020.
Translation of First Office Action dated Sep. 28, 2020 corresponding to Korean Patent Application No. 10-2018-0114808, 3 pages.
D. A. Jobson. "On the Flow of a Compressible Fluid through Orifices." Proceedings of the Institution of Mechanical Engineers. 169[1](1955). pp. 767-776. https://doi.org/10.1243/PIME_PROC_1955_ 169_077 _02 (Year: 1955).
Cashco, Inc. "Fluid Flow Basics ofThrottling Valves." 1999. pp. 1-56. Available Mar. 24, 2020 online at: https://www.controlglobal.com/assets/Media/MediaManager/RefBook_ Cash co_Fluid. pdf. (Year: 1999).
O'Keefe Controls Co. "Choked Flow of Gases." in Catalog 11. 2003. pp. 20-24 & 48. (Year: 2003).
Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
Notification of Examination Opinions corresponding to Taiwanese U.S. Appl. No. 10/512,352 dated Feb. 19, 2020, 5 pages.
First Office Action dated Mar. 17, 2020 corresponding to Chinese Patent Application 20170076027.2, 8 pages.
First Office Action with Translation dated Sep. 7, 2021 corresponding to Korean Patent Application No. 10-2017-0083210, 6 pages.
First Office Action with Translation dated Oct. 7, 2021 corresponding to Japanese Patent Application No. 2017-154893, 7 pages.
Notification of Search Report corresponding to Singapore Patent Application No. 10201808035Y dated Oct. 20, 2022, 11 pages.
Office Action dated May 29, 2023 from Korean Patent Office for Korean Patent Application No. 10-2021-0079769; 8 pages.
Translation of Second Office Action dated Feb. 16, 2021 corresponding to Japanese Application No. 2017-039058, 4 pages.
First Office Action corresponding to Taiwanese Patent Application No. 106106790 dated Oct. 7, 2020, 7 pages.
First Office Action corresponding to Chinese Patent Application No. 201710122891.1 dated Apr. 10, 2020, 14 pages.
International Search Report and Written Opinon for PCT Applicaiton No. PCT/US2019/045085 dated Dec. 20, 2019.
International Search Report and Written Opinion issued in PCT/US2017/062769, dated Aug. 21, 2018; ISA/KR.
Search Report dated Sep. 7, 2020 corresponding to European Application No. 17 919 402.2, 9 pages.
Machine Translation of Notice of Reasons for Refusal corresponding to Japanese Patent Application No. 2019-559033 dated Dec. 22, 2020, 4 pages.
Translation of Written Opinion corresponding to Singapore Application No. 11201907515W dated Mar. 15, 2020, 4 pages.
Translation of Notification of Examination Opinions dated May 4, 2020 corresponding to Taiwanese Patent Application No. 106142110, 7 pages.
Translation of Notification of Office Action dated Dec. 17, 2019 corresponding to Korean Patent Application No. 10-2018-7021511, 2 pages.
Search Report dated Feb. 19, 2020 corresponding to European Application No. 17 932 862.0, 7 pages.
Office Action dated Dec. 1, 2020 corresponding to Japanese Application No. 2019-553416, 4 pages.
Translation of Decision of Refusal dated Feb. 3, 2021 corresponding to Taiwanese Patent Application No. 106142110, 4 pages.
Translation of Decision for Grant of Patent dated Jul. 28, 2020 corresponding to Korean Application No. 10-2018-7021879, 1 page.
Translation of Written Opinion corresponding to Singapore Application No. 11201908264Q dated Feb. 19, 2020, 7 pages.
Translation of Notification of Office Action dated Dec. 19, 2019 corresponding to Korean Patent Application No. 10-2018-7021879, 7 pages.
Translation of Notification of Office Action dated Mar. 29, 2020 corresponding to Korean Patent Application No. 10-2020-7004813, 3 pages.
Translation of Decision for Grant of Patent dated Feb. 24, 2021 corresponding to Korean Application No. 10-2020-7013289, 1 page.
Translation of Notification of Office Action dated Aug. 27, 2021 corresponding to Korean Patent Application No. 10-2021-7014539, 8 pages.
Decision for Grant of Patent for Korean Application No. 10-2021-7014539 dated Feb. 23, 2022.
Notice of Reasons for Refusal for Japanese Application No. 2021-75777 dated Jul. 12, 2022.
Notice of Reason for Refusal issued in corresponding Japanese patent application No. 2019-505020 dated Oct. 16, 2020.
Office Action issued in corresponding Korean Patent Application No. 10-2018-7028683 dated Nov. 26, 2020.
Office Action issued in corresponding Taiwanese Patent Application No. 10-2018-7028683 dated Nov. 26, 2020.
Office Action issued in corresponding Taiwanese Patent Application No. 109128923 dated May 11, 2021 (4 pages).
Office Action issued in corresponding Korean Patent Application No. 10-2018-7028683 dated Apr. 27, 2022.
Supplementary Partial European Search Report issued in corresponding European Patent Application No. 18929891 dated Mar. 18, 2022.
Office Action issued in corresponding Korean Patent Application 10-2018-7028683 dated Dec. 29, 2022.
Office Action issued in corresponding Japanese Patent Application 2022-31361 dated Jan. 17, 2023 (no English translation available).
Office Action issued in corresponding Taiwanese Patent Application 111104002 dated Mar. 6, 2023.
Office Action issued in corresponding Chinese Patent Application 201880002160.6 dated Mar. 23, 2023.
International Search Report and Written Opinion of the ISA issued in PCT/US2020/024333, dated Dec. 24, 2020; ISA/KR.
Supplementary Partial European Search Report issued in corresponding European Patent Application No. 20850609 dated Aug. 3, 2023.
U.S. Appl. No. 16/487,703, filed Aug. 21, 2019, Hiran Rajitha Rathnasinghe.
U.S. Appl. No. 16/497,091, filed Sep. 24, 2019, Hiran Rajitha Rathnasinghe.
U.S. Appl. No. 17/631,984, filed Feb. 1, 2022, Hui Ling Han.
U.S. Appl. No. 17/633,727, filed Feb. 8, 2022, Rohini Mishra.
U.S. Appl. No. 17/671,211, filed Feb. 14, 2022, Christopher Kimball.
U.S. Appl. No. 17/681,606, filed Feb. 25, 2022, Hiran Rajitha Rathnasinghe.
U.S. Appl. No. 17/681,633, filed Feb. 25, 2022, Hiran Rajitha Rathnasinghe.
U.S. Appl. No. 17/913,008, filed Sep. 20, 2022, Hui Ling Han.
International Search Report and the Written Opinion of the ISA issued in PCT/US2017/061080, dated Feb. 22, 2018; ISA/KR.
International Search Report and Written Opinion issued in PCT/US2017/043527, dated Apr. 20, 2018; ISA/KR.

(56) References Cited

OTHER PUBLICATIONS

International Search Report and Written Opinion of the ISA issued in PCT/US2018/050273, dated May 13, 2019; ISA/KR.
International Search Report and Written Opinion of the ISA issued in PCT/US2020/044168, dated Nov. 17, 2020; ISA/KR.
International Search Report and Written Opinion of the ISA issued in PCT/US2020/045389, dated Nov. 17, 2020; ISA/KR.
International Search Report and Written Opinion of the ISA issued in PCT/US2021/052732, dated Jan. 21, 2022; ISA/KR.
Taiwanese Office Action for Taiwanese Application No. 110126786 dated Oct. 16, 2023.
Translation of Notification of Examination Opinions corresponding to Taiwanese Patent Application No. 106101332 dated Nov. 19, 2020, 9 pages.
Translation of Notification of Office Action dated Jun. 26, 2020 corresponding to Korean Patent Application No. 10-2018-7021511, 2 pages.

\* cited by examiner

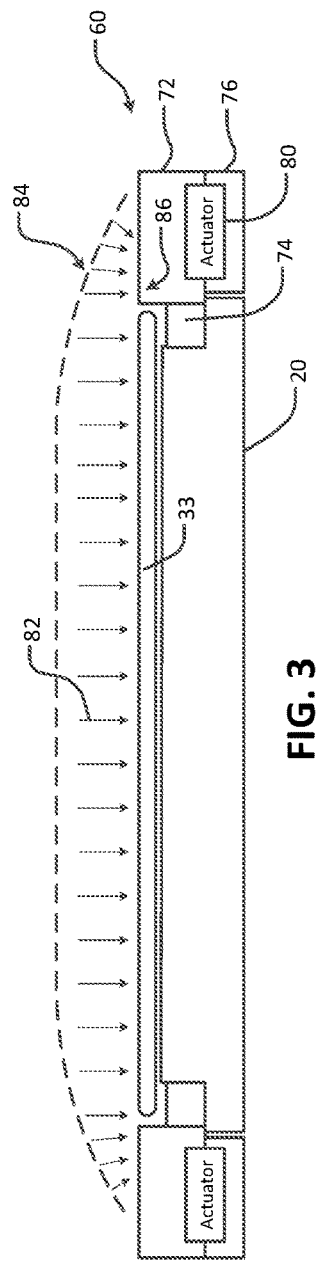
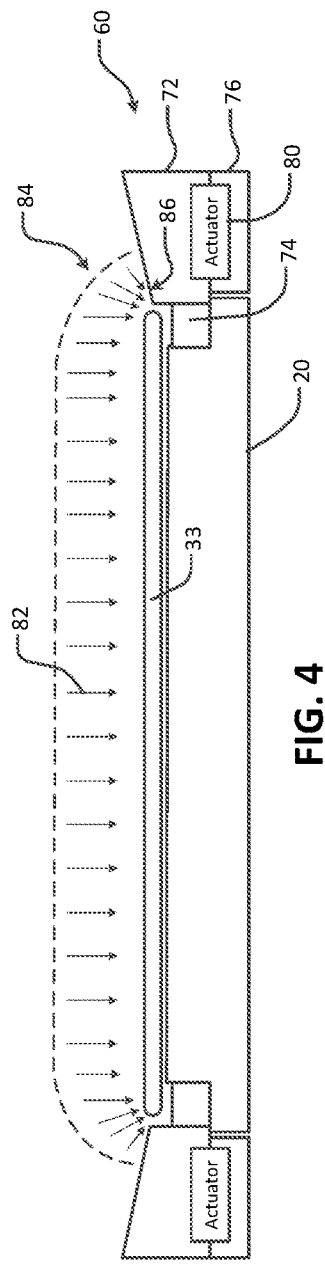
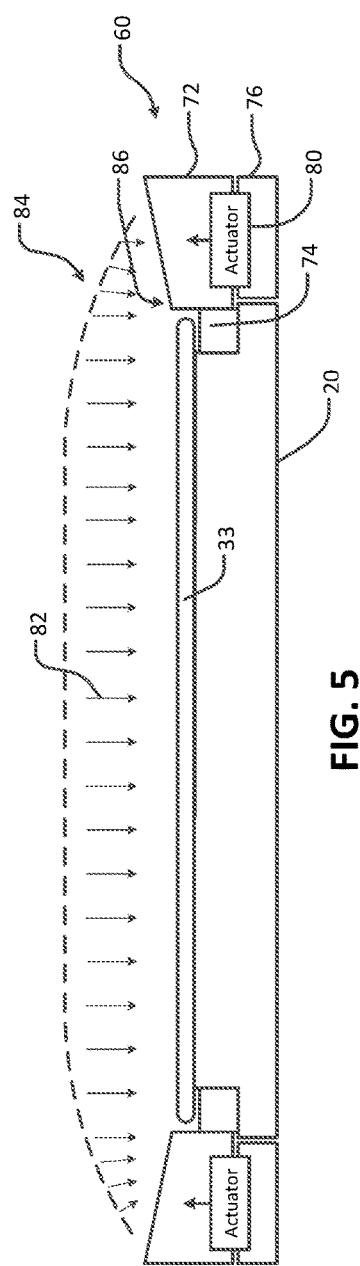
FIG. 3
FIG. 4
FIG. 5

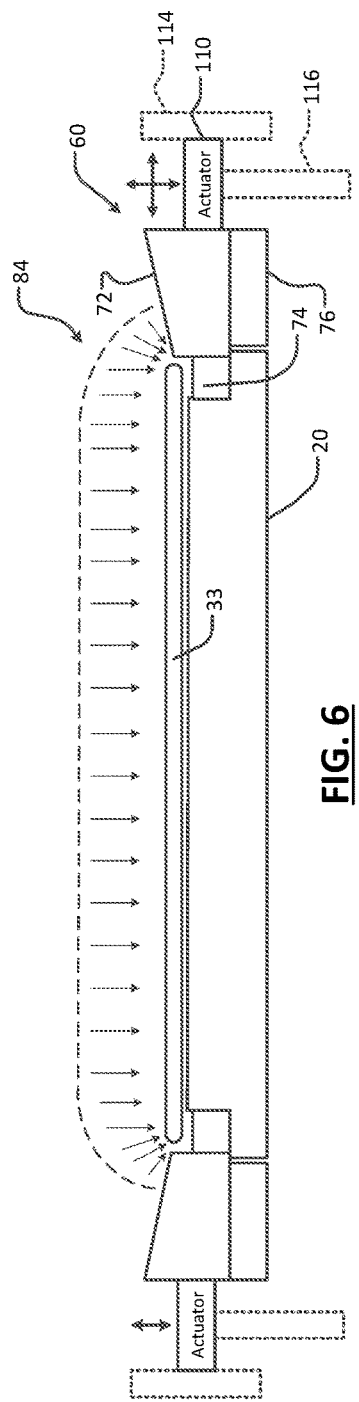
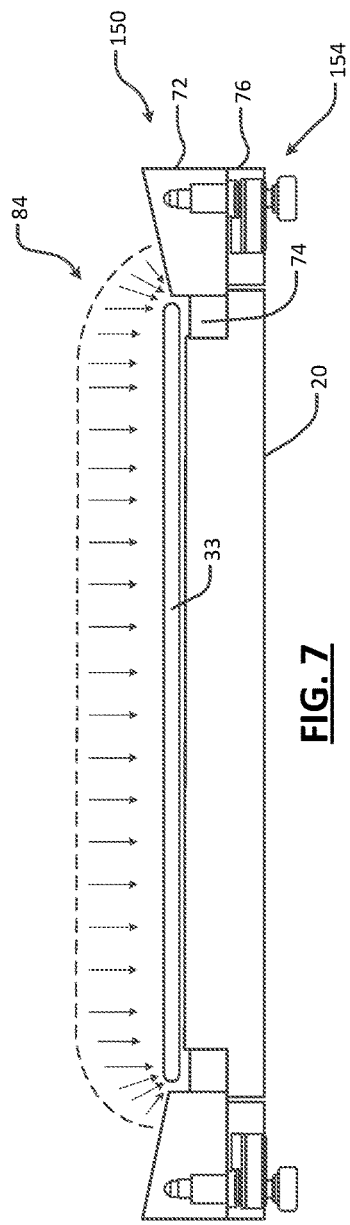
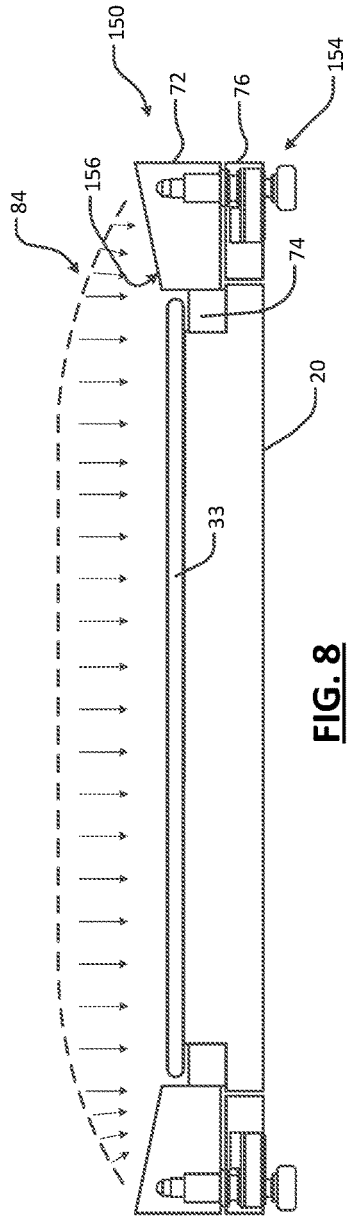

EDGE RING ARRANGEMENT WITH MOVEABLE EDGE RINGS

CROSS-REFERENCE TO RELATED APPLICATIONS

The present disclosure is a continuation of U.S. patent application Ser. No. 16/131,822, filed on Sep. 14, 2018, which is a continuation of U.S. patent application Ser. No. 14/705,430, filed on May 6, 2015, which is a continuation-in-part of U.S. patent application Ser. No. 14/598,943, filed on Jan. 16, 2015. The entire disclosures of the application referenced above are incorporated herein by reference.

FIELD

The present disclosure relates to substrate processing systems, and more particularly to edge coupling rings of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. A substrate may be arranged on a pedestal in a processing chamber of the substrate processing system. For example during etching in a plasma enhanced chemical vapor deposition (PECVD) process, a gas mixture including one or more precursors is introduced into the processing chamber and plasma is struck to etch the substrate.

Edge coupling rings have been used to adjust an etch rate and/or etch profile of the plasma near a radially outer edge of the substrate. The edge coupling ring is typically located on the pedestal around the radially outer edge of the substrate. Process conditions at the radially outer edge of the substrate can be modified by changing a position of the edge coupling ring, a shape or profile of an inner edge of the edge coupling ring, a height of the edge coupling ring relative to an upper surface of the substrate, a material of the edge coupling ring, etc.

Changing the edge coupling ring requires the processing chamber to be opened, which is undesirable. In other words, an edge coupling effect of the edge coupling ring cannot be altered without opening the processing chamber. When the edge coupling ring is eroded by plasma during etching, the edge coupling effect changes. Correcting erosion of the edge coupling ring requires the processing chamber to be opened in order to replace the edge coupling ring.

Referring now to FIGS. 1-2, a substrate processing system may include a pedestal 20 and an edge coupling ring 30. The edge coupling ring 30 may include a single piece or two or more portions. In the example in FIGS. 1-2, the edge coupling ring 30 includes a first annular portion 32 arranged near a radially outer edge of a substrate 33. A second annular portion 34 is located radially inwardly from the first annular portion below the substrate 33. A third annular portion 36 is arranged below the first annular portion 32. During use, plasma 42 is directed at the substrate 33 to etch the exposed portions of the substrate 33. The edge coupling ring 30 is arranged to help shape the plasma such that uniform etching of the substrate 33 occurs.

In FIG. 2, after the edge coupling ring 30 has been used, an upper surface of a radially inner portion of the edge coupling ring 30 may exhibit erosion as identified at 48. As a result, plasma 42 may tend to etch a radially outer edge of the substrate 33 at a faster rate than etching of radially inner portions thereof as can be seen at 44.

SUMMARY

A substrate processing system includes a processing chamber and a pedestal arranged in the processing chamber. An edge coupling ring is arranged adjacent to a radially outer edge of the pedestal. A first actuator is configured to selectively move the edge coupling ring to a raised position relative to the pedestal to provide clearance between the edge coupling ring and the pedestal to allow a robot arm to remove the edge coupling ring from the processing chamber.

In other features, a lifting ring is arranged below at least part of the edge coupling ring. The first actuator biases the lifting ring and the lifting ring biases the edge coupling ring. A pillar is arranged between the first actuator and the lifting ring. A robot arm is configured to remove the edge coupling ring from the processing chamber when the edge coupling ring and the lifting ring are in a raised position. A holder is connected to the robot arm. The holder includes a self-centering feature that mates with a self-centering feature on the edge coupling ring. The edge coupling ring includes a self-centering feature that mates with a self-centering feature on the lifting ring.

In other features, a bottom edge coupling ring is arranged below at least part of the edge coupling ring and the lifting ring. The bottom edge coupling ring includes a self-centering feature that mates with a self-centering feature on the lifting ring.

In other features, the lifting ring includes a projection that extends radially outwardly. The projection includes a groove formed on a bottom facing surface thereof. The groove is biased by the pillar when the edge coupling ring is lifted.

In other features, the robot arm removes the edge coupling ring from the processing chamber without requiring the processing chamber to be opened to atmospheric pressure. A second actuator is configured to move the edge coupling ring relative to the lifting ring to alter an edge coupling profile of the edge coupling ring. A middle edge coupling ring is arranged between at least part of the edge coupling ring and the lifting ring. The middle edge coupling ring remains stationary when the second actuator moves the edge coupling ring relative to the lifting ring.

In other features, a controller is configured to move the edge coupling ring using the second actuator in response to erosion of a plasma-facing surface of the edge coupling ring. The controller is configured to automatically move the edge coupling ring using the second actuator after the edge coupling ring is exposed to a predetermined number of etching cycles. The controller is configured to automatically move the edge coupling ring using the second actuator after the edge coupling ring is exposed to a predetermined period of etching.

In other features, a sensor is configured to communicate with the controller and to detect the erosion of the edge coupling ring. A robot arm is configured to communicate with the controller and to adjust a position of the sensor. A controller is configured to move the edge coupling ring to a first position using the second actuator for a first treatment of the substrate using a first edge coupling effect and then to a second position using the second actuator for a second treatment of the substrate using a second edge coupling effect that is different than the first edge coupling effect.

A method for maintaining an edge coupling ring in a substrate processing system includes arranging an edge coupling ring adjacent to a radially outer edge of a pedestal in a processing chamber; using a first actuator to selectively move the edge coupling ring to a raised position relative to the pedestal; and replacing the edge coupling ring using a robot arm when the edge coupling ring is in the raised position.

In other features, the method includes arranging a lifting ring below at least part of the edge coupling ring. The actuator biases the lifting ring and the lifting ring biases the edge coupling ring. The method includes arranging a pillar between the first actuator and the lifting ring. The method includes attaching a holder to the robot arm. The holder includes a self-centering feature that mates with a self-centering feature on the edge coupling ring. The method includes using a self-centering feature on the edge coupling ring to mate with a self-centering feature on the lifting ring.

In other features, the method includes arranging a bottom edge coupling ring below at least part of the edge coupling ring and the lifting ring. The method includes using a self-centering feature on the bottom edge coupling ring to mate with a self-centering feature on the lifting ring. The lifting ring includes a projection that extends radially outwardly. The projection includes a groove formed on a bottom facing surface thereof. The groove is biased by the pillar when the edge coupling ring is lifted.

In other features, the method includes moving the edge coupling ring relative to the lifting ring using a second actuator to alter an edge coupling profile of the edge coupling ring. The method includes arranging a middle edge coupling ring between at least part of the edge coupling ring and the lifting ring, wherein the middle edge coupling ring remains stationary when the second actuator moves the edge coupling ring relative to the lifting ring.

In other features, the method includes moving the edge coupling ring using the second actuator in response to erosion of a plasma-facing surface of the edge coupling ring. The method includes automatically moving the edge coupling ring after the edge coupling ring is exposed to a predetermined number of etching cycles. The method includes automatically moving the edge coupling ring after the edge coupling ring is exposed to a predetermined period of etching.

In other features, the method includes detecting erosion of the edge coupling ring using a sensor. The method includes moving the edge coupling ring to a first position using the second actuator for a first treatment of the substrate using a first edge coupling effect and then to a second position using the second actuator for a second treatment of the substrate using a second edge coupling effect that is different than the first edge coupling effect.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a side cross-sectional view of an example of a pedestal, an edge coupling ring and an actuator according to the present disclosure;

FIG. 4 is a side cross-sectional view of the pedestal, the edge coupling ring and the actuator of FIG. 3 after erosion of the edge coupling ring has occurred;

FIG. 5 is a side cross-sectional view of the pedestal, the edge coupling ring and the actuator of FIG. 3 after erosion of the edge coupling ring has occurred and the actuator is moved;

FIG. 6 is a side cross-sectional view of another example of a pedestal, an edge coupling ring and an actuator located in another position according to the present disclosure;

FIG. 7 is a side cross-sectional view of another example of a pedestal, an edge coupling ring and a piezoelectric actuator according to the present disclosure;

FIG. 8 is a side cross-sectional view of the pedestal, the edge coupling ring and the piezoelectric actuator of FIG. 7 after erosion has occurred and the piezoelectric actuator is moved;

In the drawings, reference numbers may be reused to identify similar and/or identical elements.

DETAILED DESCRIPTION

Figure 1:
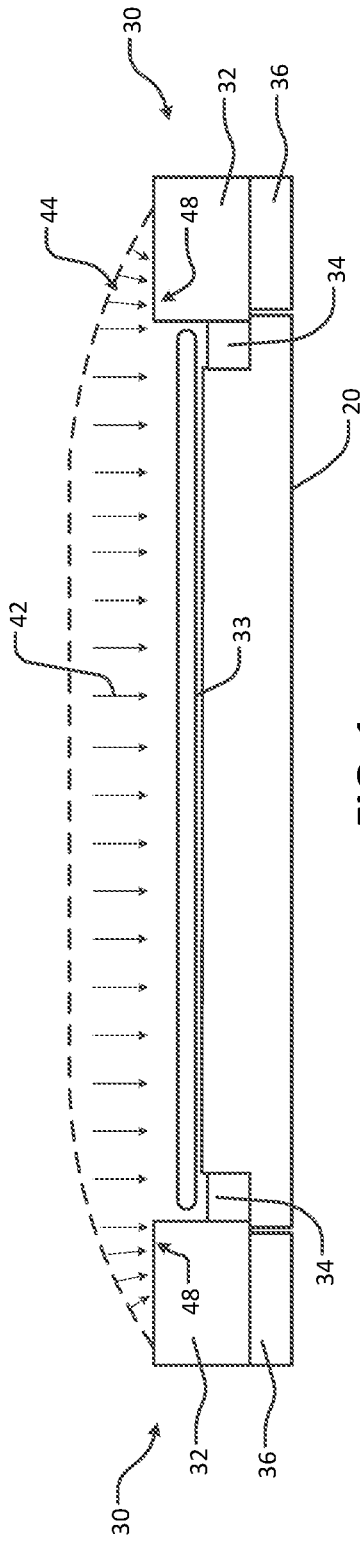
FIG. 1 is a side cross-sectional view of a pedestal and an edge coupling ring according to the prior art.
Figure 2:
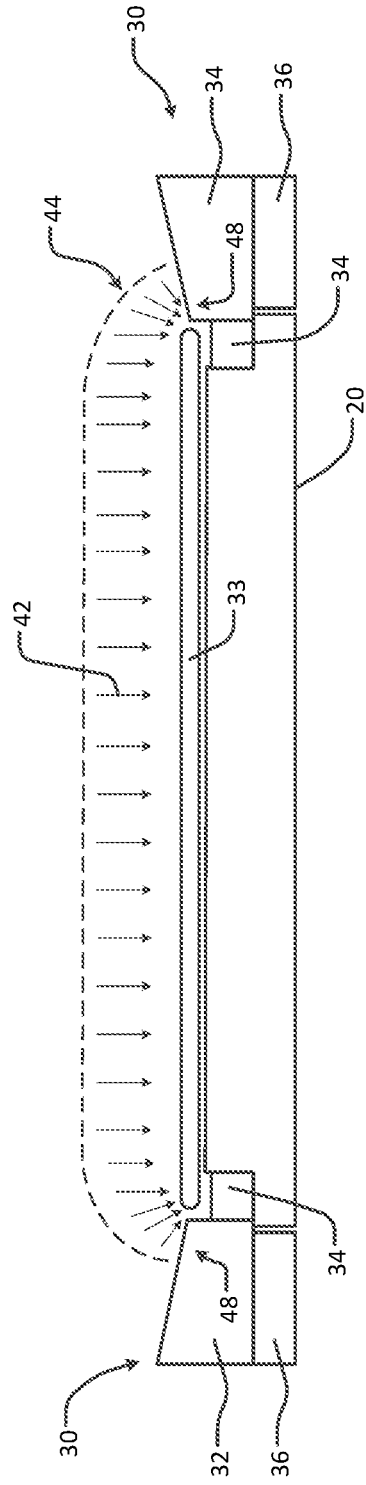
FIG. 2 is a side cross-sectional view of a pedestal and an edge coupling ring according to the prior art after erosion of the edge coupling ring has occurred.

The present disclosure allows one or more portions of an edge coupling ring to be moved vertically and/or horizontally relative to a substrate or pedestal in a substrate processing system. The movement changes an edge coupling effect of the plasma relative to the substrate during etching or other substrate treatment without requiring the processing chamber to be opened.

Referring now to FIGS. 3-5, a substrate processing system includes a pedestal 20 and an edge coupling ring 60. The edge coupling ring 60 may be made of a single portion or two or more portions may be used. In the example in FIGS. 3-5, the edge coupling ring 60 includes a first annular portion 72 arranged radially outside of the substrate 33. A second annular portion 74 is located radially inwardly from the first annular portion 72 below the substrate 33. A third annular portion 76 is arranged below the first annular portion 72.

An actuator 80 may be arranged in various locations to move one or more portions of the edge coupling ring 60 relative to the substrate 33 as will be described further below. For example only, in FIG. 3 the actuator 80 is arranged between the first annular portion 72 of the edge coupling ring 60 and the third annular portion 76 of the edge coupling ring 60. In some examples, the actuator 80 may include a piezoelectric actuator, a stepper motor, a pneumatic drive, or other suitable actuator. In some examples, one, two, three, or four or more actuators are used. In some examples, multiple actuators are arranged uniformly around the edge coupling ring 60. The actuator(s) 80 may be arranged inside or outside of the processing chamber.

During use, plasma 82 is directed at the substrate 33 to etch the exposed portions of the substrate 33. The edge coupling ring 60 is arranged to help shape the plasma electric field such that uniform etching of the substrate 33 occurs. As can be seen at 84 and 86 in FIG. 4, one or more portions of the edge coupling ring 60 may be eroded by the plasma 82. As a result of the erosion, non-uniform etching of the substrate 33 may occur near a radially outer edge of the substrate 33. Normally, the process would need to be stopped, the processing chamber opened and the edge coupling ring replaced.

In FIG. 5, the actuator 80 is used to move one or more portions of the edge coupling ring 60 to alter the position of the one or more portions of the edge coupling ring 60. For example, the actuator 80 may be used to move the first annular portion 72 of the edge coupling ring 60. In this example, the actuator 80 moves the first annular portion 72 of the edge coupling ring 60 in an upward or vertical direction such that an edge 86 of the first annular portion 72 of the edge coupling ring 60 is higher relative to the radially outer edge of the substrate 33. As a result, etch uniformity near the radially outer edge of the substrate 33 is improved.

Referring now to FIG. 6, as can be appreciated, the actuator may be arranged in one or more other locations and may move in other directions such as horizontal, diagonal, etc. Horizontal movement of the portion of the edge coupling ring may be performed to center the edge coupling effect relative to the substrate. In FIG. 6, an actuator 110 is arranged radially outside of the edge coupling ring 60. In addition, the actuator 110 moves in a vertical (or an up/down) direction as well as in a horizontal (or side to side) direction. Horizontal repositioning may be used when etching of the substrates shows a horizontal offset of the edge coupling ring relative to the substrates. The horizontal offset may be corrected without opening the processing chamber. Likewise, tilting of the edge coupling ring may be performed by actuating some of the actuators differently than others of the actuators to correct or create side-to-side asymmetry.

Rather than locating the actuator 110 between annular portions of the edge coupling ring, the actuator 110 may also be attached to a radially outer wall or other structure identified at 114. Alternately, the actuator 110 may be supported from below by a wall or other structure identified at 116.

Referring now to FIG. 7-8, another example of an edge coupling ring 150 and a piezoelectric actuator 154 is shown. In this example, the piezoelectric actuator 154 moves the edge coupling ring 150. The piezoelectric actuator 154 is mounted in the first annular portion 72 and the third annular portion 76 of the edge coupling ring 150. In FIG. 8, the piezoelectric actuator 154 moves the first annular portion 72 of the edge coupling ring 150 to adjust a position of an edge 156 of the first annular portion 72.

Figure 9:
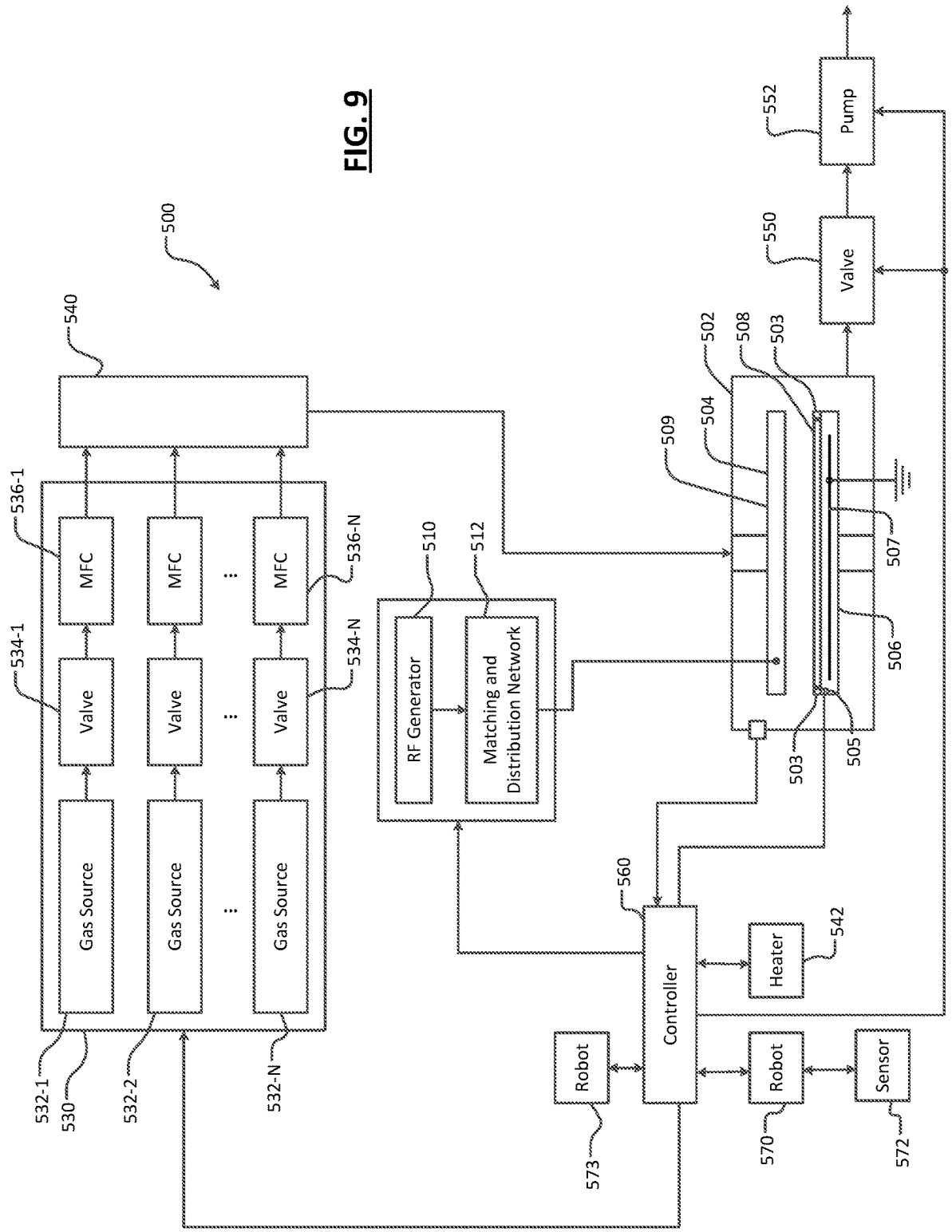
FIG. 9 is a functional block diagram of an example of a substrate processing chamber including a pedestal, an edge coupling ring and an actuator according to the present disclosure.

Referring now to FIG. 9, an example of a substrate processing chamber 500 for performing etching using RF plasma is shown. The substrate processing chamber 500 includes a processing chamber 502 that encloses other components of the substrate processing chamber 500 and contains the RF plasma. The substrate processing chamber 500 includes an upper electrode 504 and a pedestal 506 including a lower electrode 507. An edge coupling ring 503 is supported by the pedestal 506 and is arranged around the substrate 508. One or more actuators 505 may be used to move the edge coupling ring 503. During operation, a substrate 508 is arranged on the pedestal 506 between the upper electrode 504 and the lower electrode 507.

For example only, the upper electrode 504 may include a showerhead 509 that introduces and distributes process gases. The showerhead 509 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 504 may include a conducting plate and the process gases may be introduced in another manner. The lower electrode 507 may be arranged in a non-conductive pedestal. Alternately, the pedestal 506 may include an electrostatic chuck that includes a conductive plate that acts as the lower electrode 507.

An RF generating system 510 generates and outputs an RF voltage to one of the upper electrode 504 and the lower electrode 507. The other one of the upper electrode 504 and the lower electrode 507 may be DC grounded, AC grounded or floating. For example only, the RF generating system 510 may include an RF voltage generator 511 that generates the RF voltage that is fed by a matching and distribution network 512 to the upper electrode 504 or the lower electrode 507. In other examples, the plasma may be generated inductively or remotely.

A gas delivery system 530 includes one or more gas sources 532-1, 532-2, ..., and 532-N (collectively gas sources 532), where N is an integer greater than zero. The gas sources supply one or more precursors and mixtures thereof. The gas sources may also supply purge gas. Vaporized precursor may also be used. The gas sources 532 are connected by valves 534-1, 534-2, ..., and 534-N (collectively valves 534) and mass flow controllers 536-1, 536-2, ..., and 536-N (collectively mass flow controllers 536) to a manifold 540. An output of the manifold 540 is fed to the processing chamber 502. For example only, the output of the manifold 540 is fed to the showerhead 509.

A heater 542 may be connected to a heater coil (not shown) arranged in the pedestal 506. The heater 542 may be used to control a temperature of the pedestal 506 and the substrate 508. A valve 550 and pump 552 may be used to evacuate reactants from the processing chamber 502. A controller 560 may be used to control components of the substrate processing chamber 500. The controller 560 may also be used to control the actuator 505 to adjust a position of one or more portions of the edge coupling ring 503.

A robot 570 and a sensor 572 may be used to measure erosion of the edge coupling ring. In some examples, the sensor 572 may include a depth gauge. The robot 570 may move the depth gauge in contact with the edge coupling ring to measure erosion. Alternately, a laser interferometer (with or without the robot 570) may be used to measure erosion without direct contact. The robot 570 may be omitted if the laser interferometer can be positioned with a direct line of sight to the edge coupling ring.

Another robot arm 573 may be used to deliver and remove substrates onto the pedestal 506. Additionally, the robot arm 573 may be used to deliver unused edge coupling rings onto a lifting ring and to replace used edge coupling rings after sufficient wear as will be described further below in conjunction with FIGS. 15-23. While the same robot arm 573 may be used for both substrates and edge coupling rings, dedicated robot arms may also be used.

Figures 10, 11:
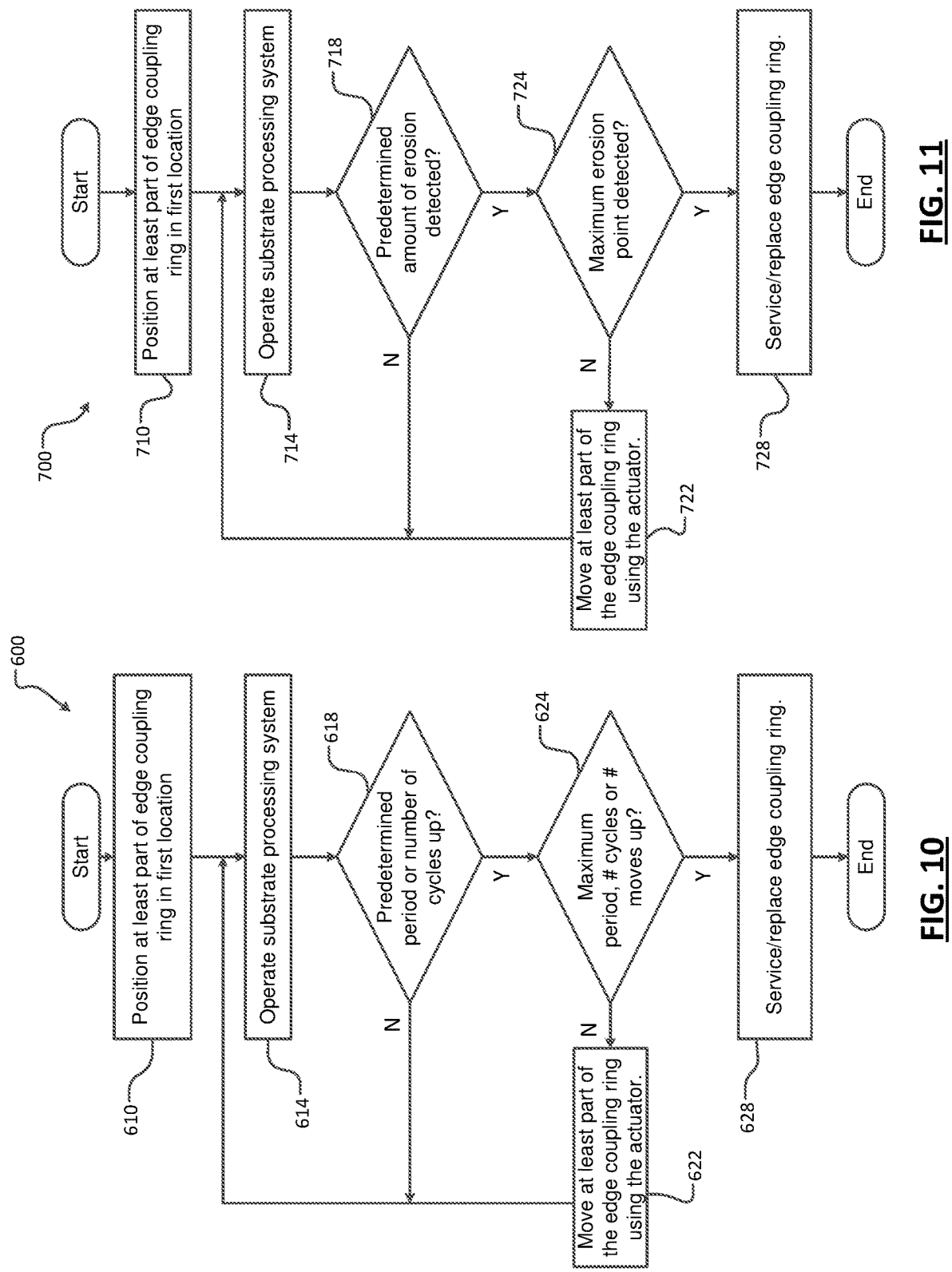
FIG. 10 is a flowchart illustrating steps of an example of a method for operating the actuator to move the edge coupling ring according to the present disclosure.
FIG. 11 is a flowchart illustrating steps of another example of a method for operating the actuator to move the edge coupling ring according to the present disclosure.

Referring now to FIG. 10, an example of a method 600 for operating the actuator to move the edge coupling ring is shown. At 610, at least part of an edge coupling ring is positioned in a first location relative to the substrate. At 614, the substrate processing system is operated. The operation may include etching or other treatment of a substrate. At 618, control determines whether a predetermined period of etching or a predetermined number etching cycles have occurred. If the predetermined period or number of cycles is not exceeded as determined at 618, control returns to 614.

When the predetermined period or number of cycles are up, control determines at 624 whether a maximum predetermined etching period is up, a maximum number of etching cycles has occurred and/or a maximum # of actuator moves have occurred.

If 624 is false, control moves at least part of the edge coupling ring using the actuator. Movement of the edge coupling ring can be performed automatically, manually or a combination thereof without opening the processing chamber. If 624 is true, control sends a message or otherwise indicates that the edge coupling ring should be serviced/replaced.

Referring now to FIG. 11, an example of a method 700 for operating the actuator to move the edge coupling ring is shown. At 710, at least part of an edge coupling ring is positioned in a first location relative to the substrate. At 714, the substrate processing system is operated. The operation may include etching or other treatment of a substrate. At 718, control determines whether a predetermined amount of erosion of the edge coupling ring has occurred using a sensor such as a depth gauge or laser interferometer. If 718 is false, control returns to 714.

When the predetermined amount of erosion has occurred, control determines at 724 whether a maximum amount of erosion has occurred. If 724 is false, control moves at least part of the edge coupling ring using the actuator. Movement of the edge coupling ring can be performed automatically, manually or a combination thereof without opening the processing chamber. If 724 is true, control sends a message or otherwise indicates that the edge coupling ring should be serviced/replaced.

In addition to the foregoing, a determination of whether or not the edge coupling ring needs to be moved may be based on inspection of etching patterns of the substrates after processing. The actuator may be used to adjust the edge coupling profile of the edge coupling ring without opening the chamber.

Figure 12:
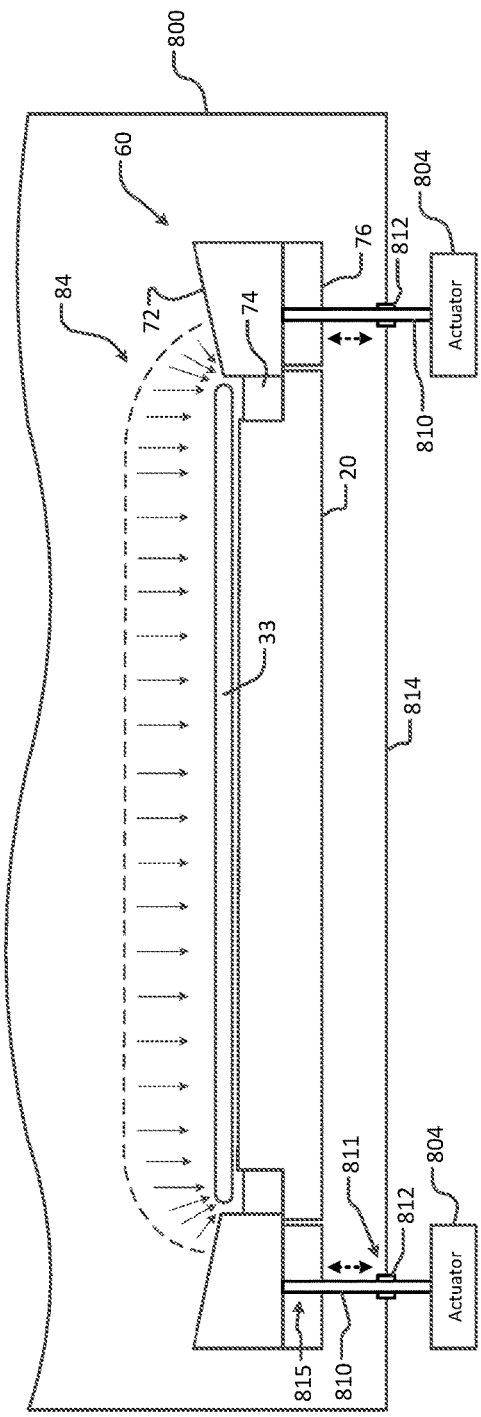
FIG. 12 is a functional block diagram of an example of a processing chamber including an edge coupling ring movable by actuators arranged outside of the processing chamber according to the present disclosure.

Referring now to FIG. 12, a processing chamber 800 includes an edge coupling ring 60 arranged on a pedestal 20. The edge coupling ring 60 includes one or more portions that are movable by one or more actuators 804 arranged outside of the processing chamber 800. In this example, the first annular portion 72 is movable. The actuators 804 may be connected by mechanical linkage 810 to the first annular portion 72 of the edge coupling ring 60. For example, the mechanical linkage 810 may include a rod member. The mechanical linkage 810 may pass through a hole 811 in a wall 814 of the processing chamber 800. A seal 812 such as an "O"-ring may be used. The mechanical linkage 810 may pass through holes 815 in one or more structures such as the third annular portion 76 of the edge coupling ring 60.

Figure 13A:
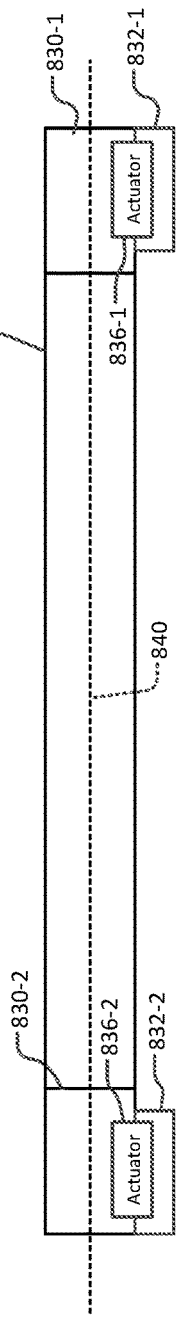
FIGS. 13A and 13B illustrates an example of side-to-side tilting of an edge coupling ring according to the present disclosure.
Figure 13B:
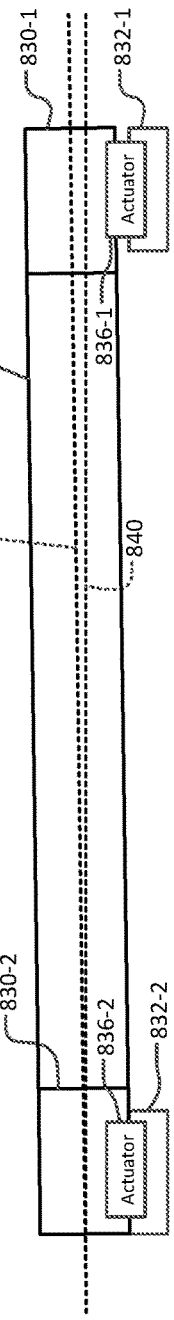

Referring now to FIGS. 13A and 13B, side-to-side tilting of an edge coupling ring 830 is shown. Side-to-side tilting may be used to correct side-to-side misalignment. In FIG. 13A, portions 830-1 and 830-2 of an edge coupling ring 830 on opposite sides of the substrate are arranged in a first arrangement 840. The portions 830-1 and 830-2 may be generally aligned with portions 832-1 and 832-2 of the edge coupling ring 830. Actuators 836-1 and 836-2 are arranged between the portions 830-1 and 832-1 and 830-2 and 832-2, respectively.

In FIG. 13B, the actuators 836-1 and 836-2 move the respective portions of the edge coupling ring 830 such that the edge coupling ring 830 moves to a second arrangement 850 that is different than the first arrangement 840 shown in FIG. 13A. As can be appreciated, the substrates may be inspected after treatment and the tilt relative to the substrate may be adjusted as needed without opening the processing chamber.

Figure 14:
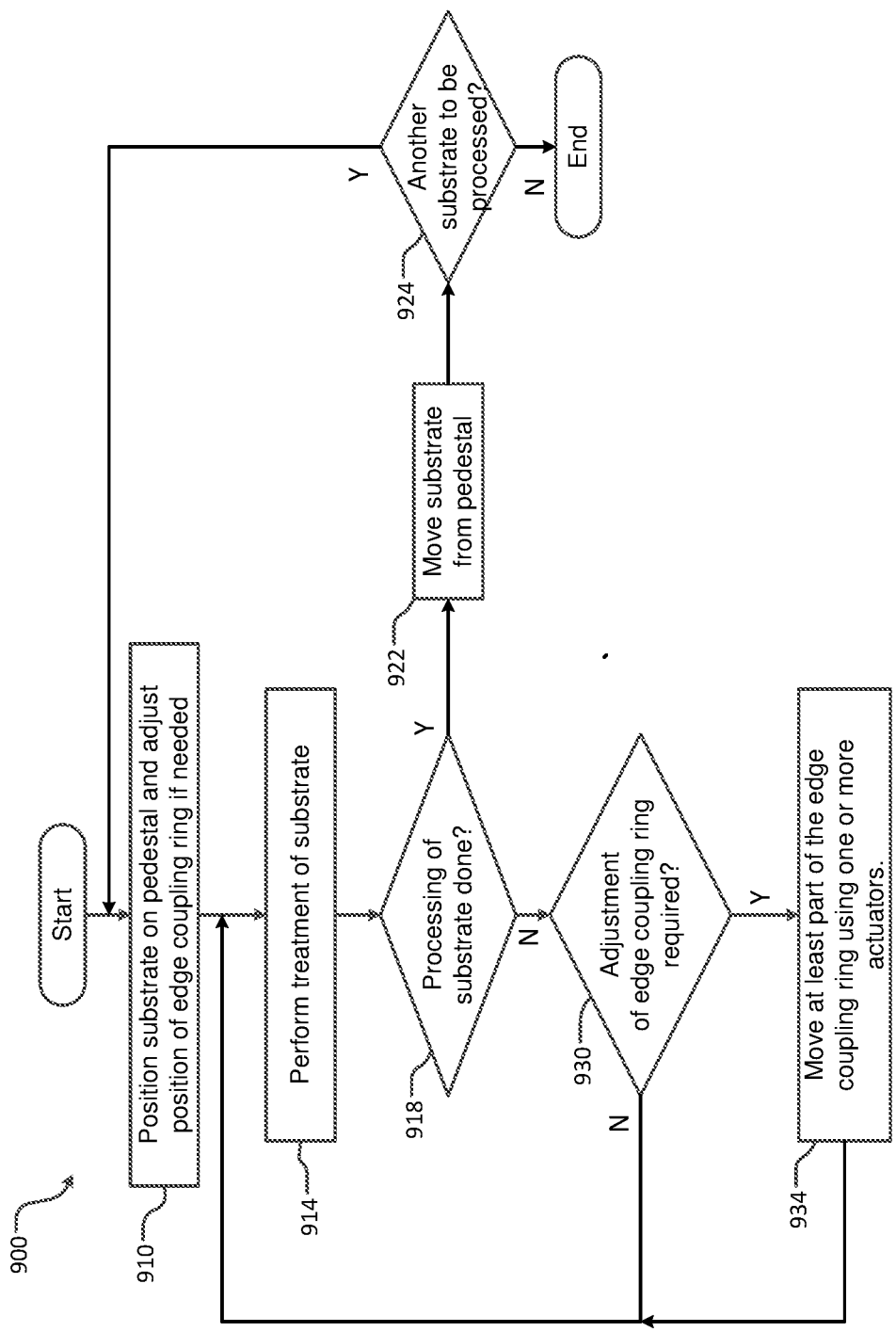
FIG. 14 illustrates an example of a method for moving an edge coupling ring during processing of a substrate.

Referring now to FIG. 14, a method 900 for moving an edge coupling ring during processing of a substrate is shown. In other words, different treatments may be performed on a single substrate in the same processing chamber. The edge coupling effect of the edge coupling ring may be adjusted between the multiple treatments performed on the substrate in the same processing chamber before proceeding to a subsequent substrate. At 910, a substrate is positioned on a pedestal and a position of the edge coupling ring is adjusted if needed. At 914, treatment of the substrate is performed. If processing of the substrate is done as determined at 918, the substrate is removed from the pedestal at 922. At 924, control determines whether another substrate needs to be processed. If 924 is true, the method returns to 910. Otherwise the method ends.

If 918 is false and the substrate needs additional treatment, the method determines whether adjustment of the edge coupling ring is required at 930. If 930 is false, the method returns to 914. If 930 is true, at least part of the edge coupling ring is moved using one or more actuators at 934 and the method returns to 914. As can be appreciated, the edge coupling ring can be adjusted between treatments of the same substrate in the same processing chamber.

Figure 15:
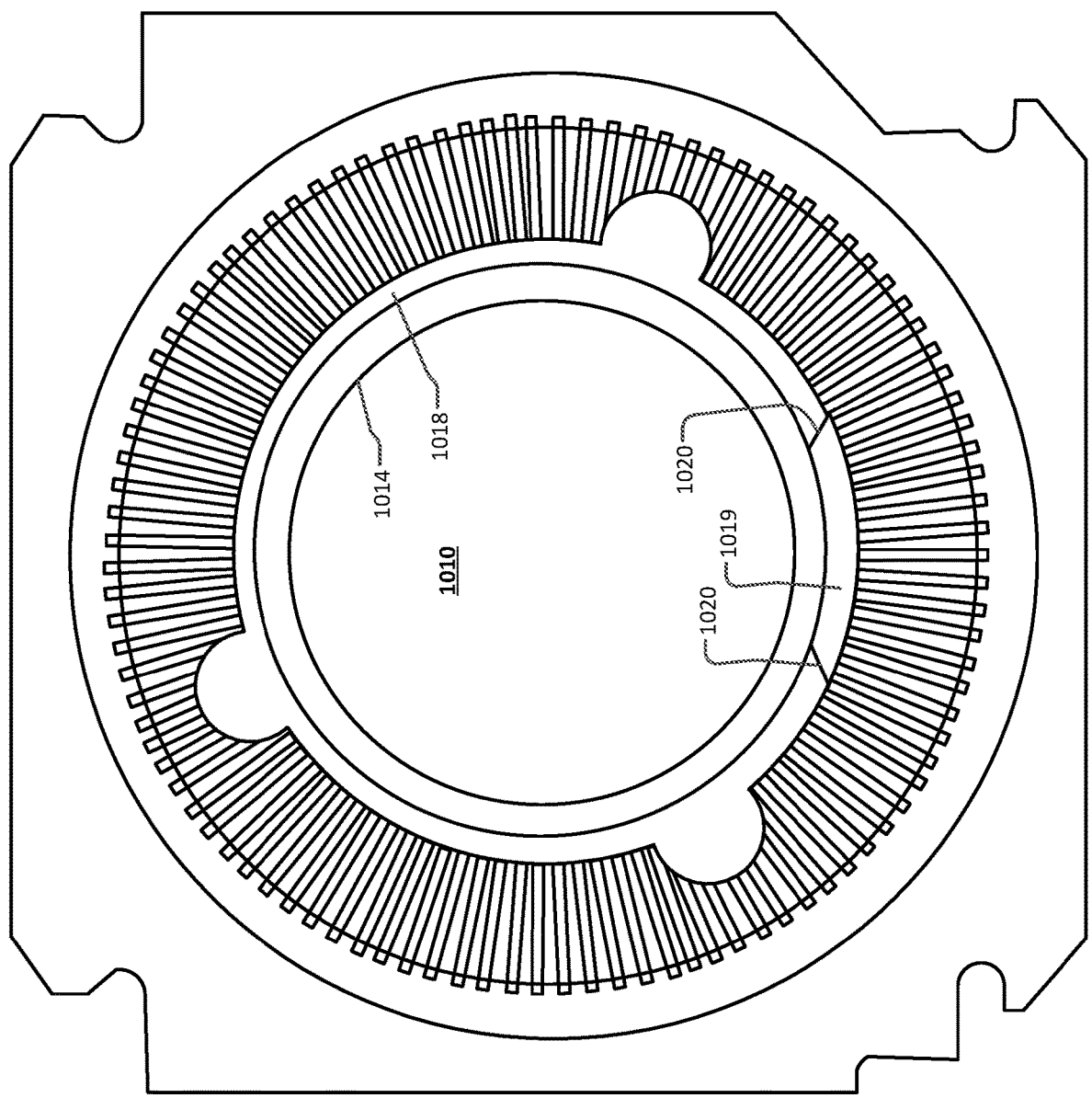
FIG. 15 is a plan view of an example of a pedestal including an edge coupling ring and a lifting ring.

Referring now to FIG. 15, an edge coupling ring 1014 and a lifting ring 1018 are arranged adjacent to and around an upper surface of a pedestal 1010. The edge coupling ring 1014 includes a radially inner edge that is arranged adjacent to the substrate during etching as described above. The lifting ring 1018 is arranged below at least part of the edge coupling ring 1014. The lifting ring 1018 is used to raise the edge coupling ring 1014 above a surface of the pedestal 1010 when removing the edge coupling ring 1014 using a robot arm. The edge coupling ring 1014 can be removed without requiring the processing chamber to be opened to atmospheric pressure. In some examples, the lifting ring 1018 may optionally include an open portion 1019 between circumferentially spaced ends 1020 to provide clearance for a robot arm to remove the edge coupling ring 1014 as will be described below.

Figure 16:
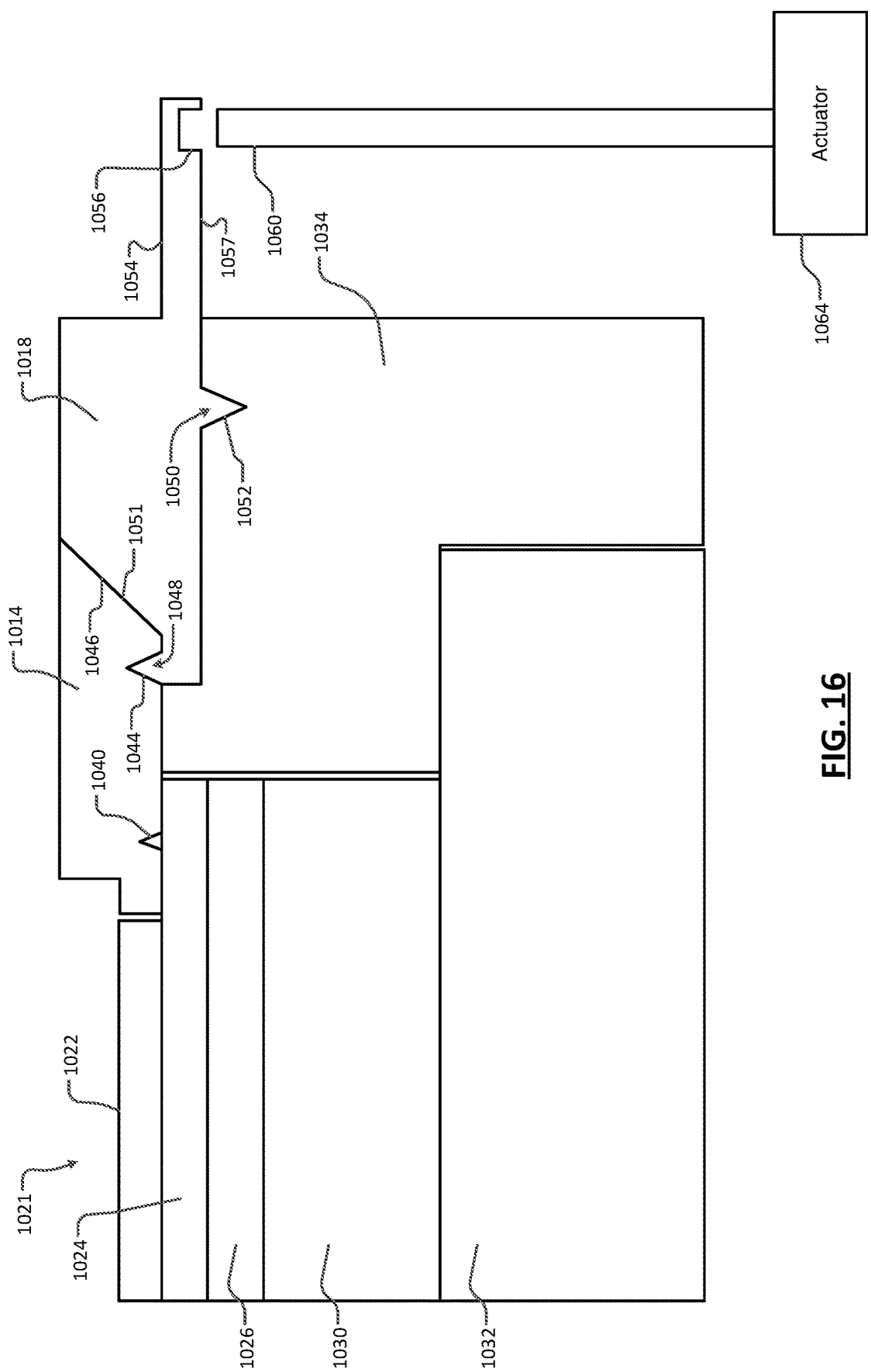
FIG. 16 is a side cross-sectional view of an example of the edge coupling ring and lifting ring.
Figure 17:
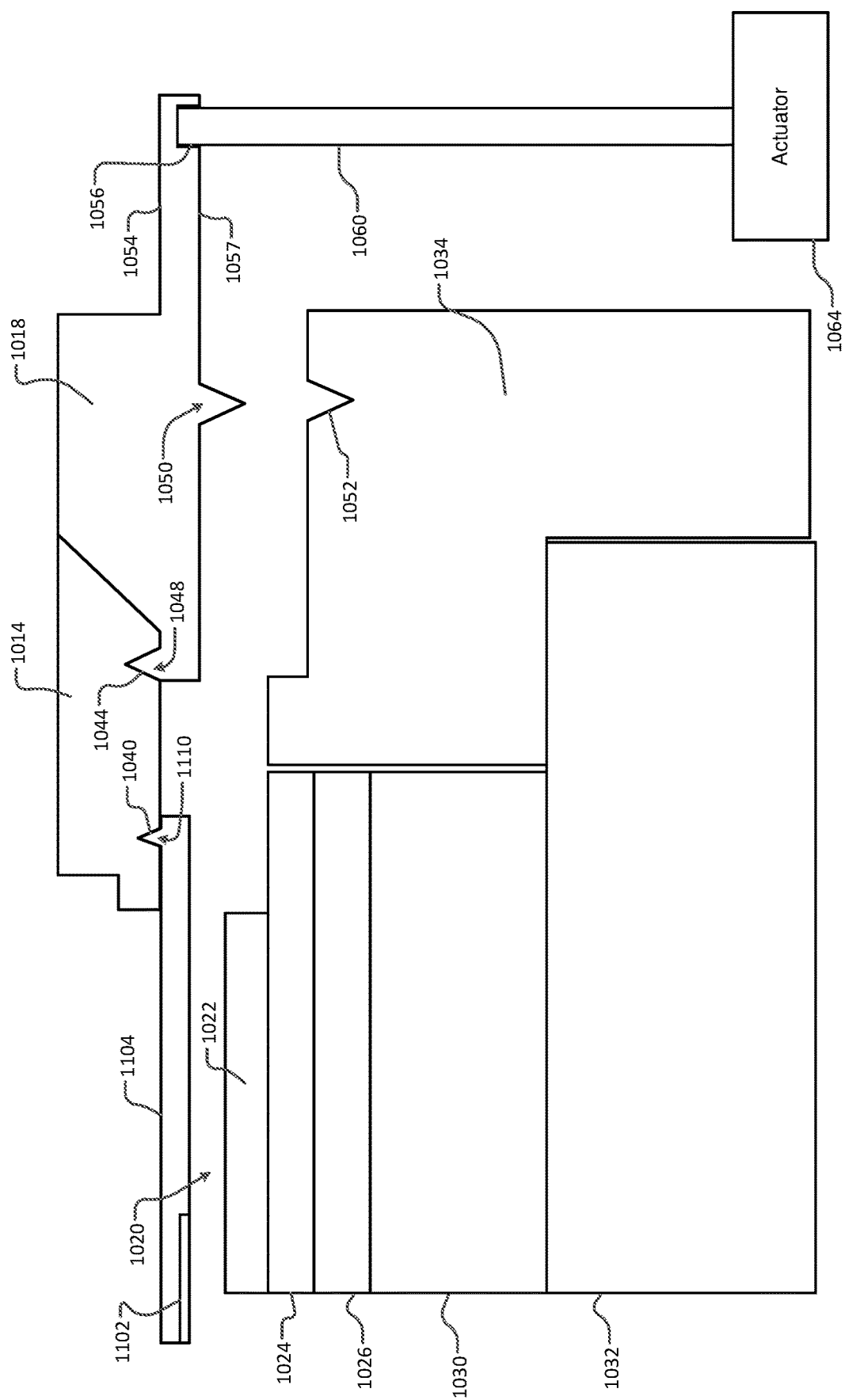
FIG. 17 is a side cross-sectional view of an example of the edge coupling ring being lifted by the lifting ring and the edge coupling ring being removed by a robot arm.

Referring now to FIGS. 16-17, an example of the edge coupling ring 1014 and lifting ring 1018 are shown in further detail. In the example shown in FIG. 16, the pedestal may include an electrostatic chuck (ESC) generally identified at 1021. The ESC 1021 may include one or more stacked plates such as ESC plates 1022, 1024, 1030 and 1032. The ESC plate 1030 may correspond to a middle ESC plate and the ESC plate 1032 may correspond to an ESC baseplate. In some examples, an O-ring 1026 may be arranged between the ESC plates 1024 and 1030. While a specific pedestal 1010 is shown, other types of pedestals may be used.

A bottom edge coupling ring 1034 may be arranged below the edge coupling ring 1014 and the lifting ring 1018. The bottom edge coupling ring 1034 may be arranged adjacent to and radially outside of the ESC plates 1024, 1030 and 1032 and the O-ring 1026.

In some examples, the edge coupling ring 1014 may include one or more self-centering features 1040, 1044 and 1046. For example only, the self-centering features 1040 and 1044 may be triangular-shaped, female self-centering features, although other shapes may be used. The self-centering feature 1046 may be a sloped surface. The lifting ring 1018 may include one or more self-centering features 1048, 1050 and 1051. For example only, the self-centering features 1048 and 1050 may be triangular-shaped, male self-centering features, although other shapes may be used. The self-centering feature 1051 may be a sloped surface having a complementary shape to the self-centering feature 1046. The self-centering feature 1048 on the lifting ring 1018 may mate with the self-centering feature 1044 on the edge coupling ring 1014. The self-centering feature 1050 on the lifting ring 1018 may mate with a self-centering feature 1052 of the bottom edge coupling ring 1034.

The lifting ring 1018 further includes a projection 1054 that extends radially outwardly. A groove 1056 may be arranged on a bottom-facing surface 1057 of the projection 1054. The groove 1056 is configured to be biased by one end of a pillar 1060 that is connected to and selectively moved vertically by an actuator 1064. The actuator 1064 may be controlled by the controller. As can be appreciated, while a single groove, pillar and actuator are shown, additional grooves, pillars and actuators may be circumferentially arranged in a spaced relationship around the lifting ring 1018 to bias the lifting ring 1018 in an upward direction.

In FIG. 17, the edge coupling ring 1014 is shown raised in an upward direction by the lifting ring 1018 using the pillar(s) 1060 and the actuator(s) 1064. The edge coupling ring 1014 can be removed from the processing chamber by a robot arm. More particularly, a robot arm 1102 is connected to the edge coupling ring 1014 by a holder 1104. The holder 1104 may include a self-centering feature 1110 that mates with the self-centering feature 1040 on the edge coupling ring 1014. As can be appreciated, the robot arm 1102 and the holder 1104 may bias the edge coupling ring upwardly to clear the self-centering feature 1048 on the lifting ring 1018. Then, the robot arm 1102, the holder 1104 and the edge coupling ring 1014 can be moved out of the processing chamber. The robot arm 1102, the holder 1104 and a new edge coupling ring can be returned and positioned on the lifting ring 1018. Then, the lifting ring 1018 is lowered. The opposite operation may be used to deliver a new edge coupling ring 1014 onto the lifting ring 1018.

Alternately, instead of lifting the robot arm 1102 and holder 1104 upwardly to lift the edge coupling ring 1014 off of the lifting ring 1018, the robot arm 1102 and holder 1104 can be positioned below and in contact with the raised edge coupling ring 1014. Then, the lifting ring 1018 is lowered and the edge coupling ring 1014 remains on the robot arm 1102 and holder 1104. The robot arm 1102, the holder 1104 and the edge coupling ring 1014 can be removed from the processing chamber. The opposite operation may be used to deliver a new edge coupling ring 1014 onto the lifting ring 1018.

Figure 18:
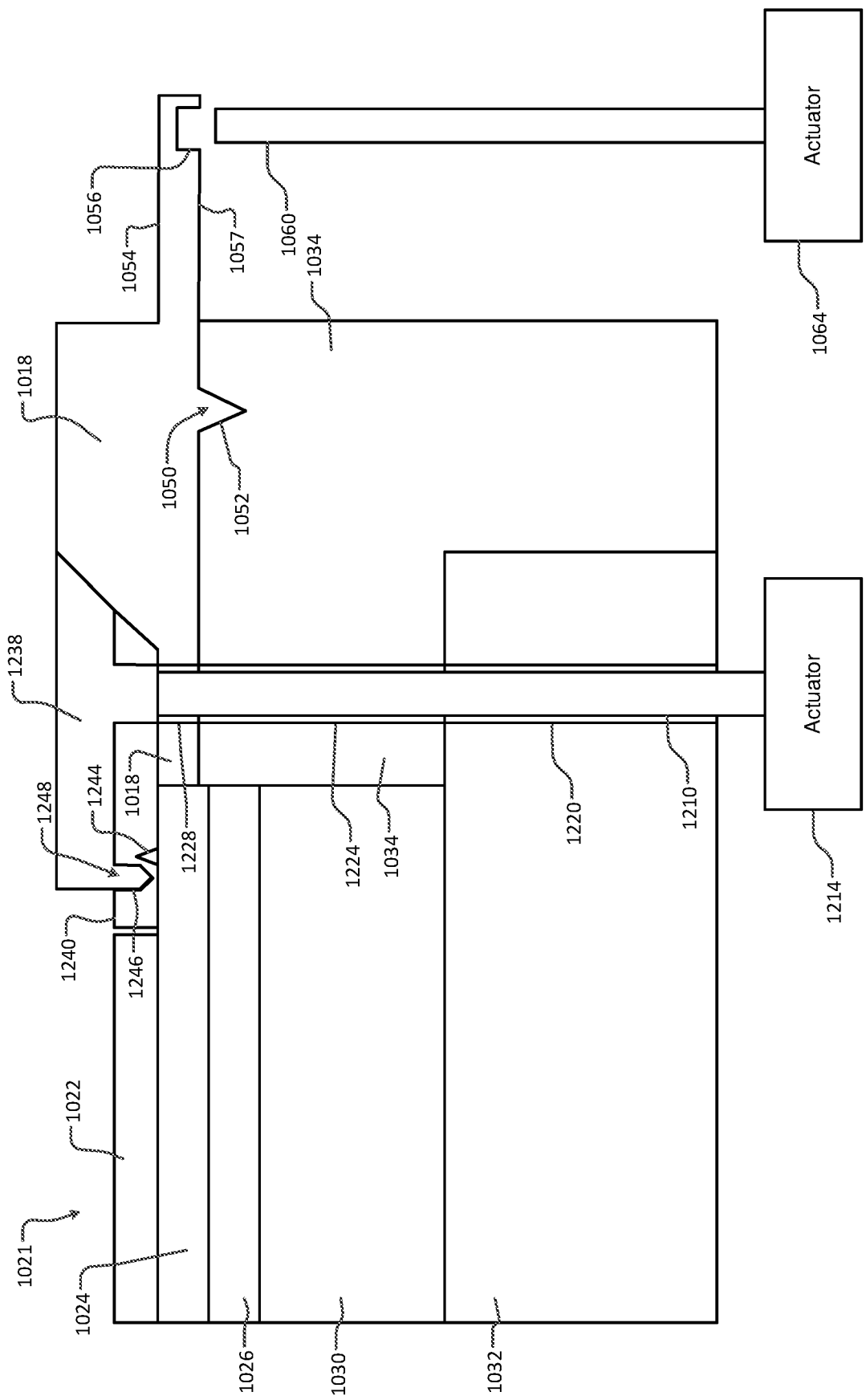
FIG. 18 is a side cross-sectional view of an example of a movable edge coupling ring and a lifting ring.
Figure 19:
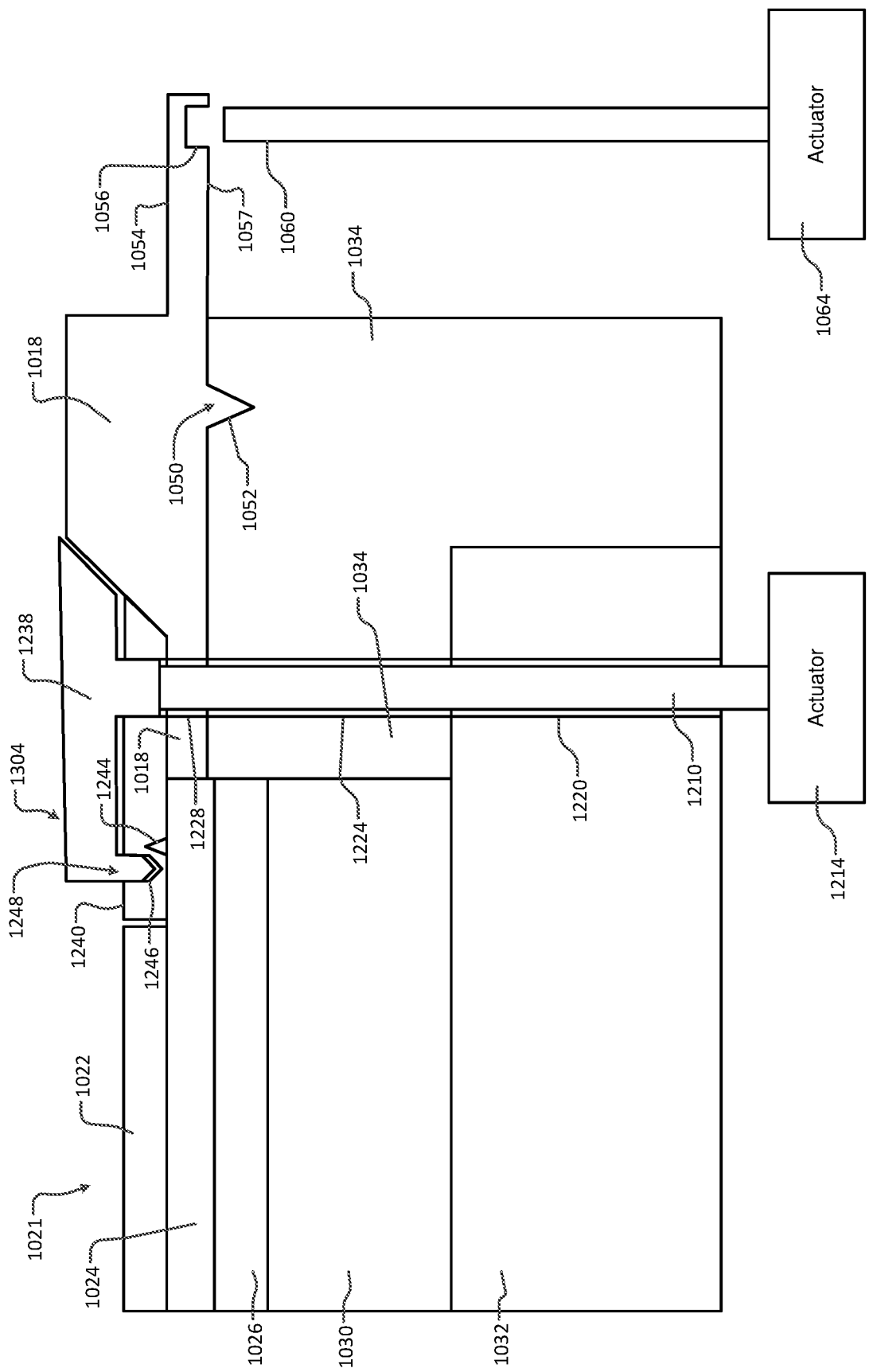
FIG. 19 is a side cross-sectional view of the movable edge coupling ring of FIG. 18 in a raised position.
Figure 20:
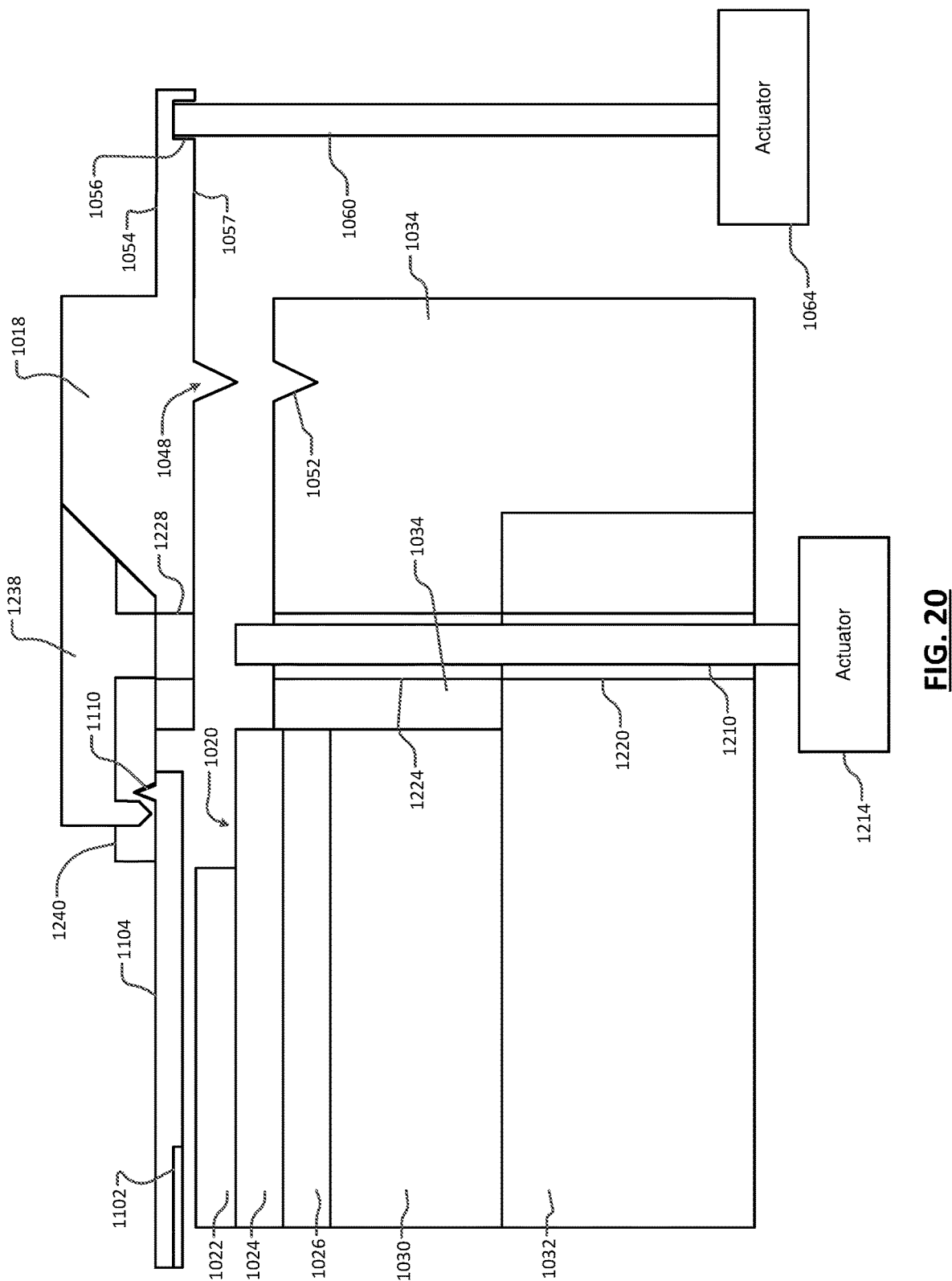
FIG. 20 is a side cross-sectional view of the edge coupling ring of FIG. 18 being lifted by the lifting ring and the edge coupling ring being removed by a robot arm.

Referring now to FIGS. 18-20, a movable edge coupling ring 1238 and a lifting ring 1018 are shown. In FIG. 18, one or more pillars 1210 are moved up and down by one or more actuators 1214 through bores 1220, 1224 and 1228 in the ESC baseplate 1032, the bottom edge coupling ring 1034 and the lifting ring 1018, respectively. In this example, a middle edge coupling ring 1240 or spacer is arranged between the movable edge coupling ring 1238 and the lifting ring 1018. The middle edge coupling ring 1240 may include self-centering features 1244 and 1246. A corresponding self-centering feature 1248 may be provided on the movable edge coupling ring 1238. The self-centering feature 1248 mates with the self-centering feature 1246 on the middle edge coupling ring 1240.

As is described in detail above, erosion of an upwardly facing surface of the movable edge coupling ring 1238 may occur during use. This, in turn, may alter the profile of the plasma. The movable edge coupling ring 1238 may be selectively moved in an upward direction using the pillars 1210 and the actuators 1214 to alter the profile of the plasma. In FIG. 19, the movable edge coupling ring 1238 of FIG. 18 is shown in a raised position. The middle edge coupling ring 1240 may remain stationary. Eventually, the movable edge coupling ring 1238 may be moved one or more times and then the edge coupling ring 1238 and the middle edge coupling ring 1240 may be replaced.

In FIG. 20, the actuator 1214 is returned to a lowered state and the actuator 1064 is moved to a raised state. The edge coupling ring 1238 and the middle edge coupling ring 1240 are lifted by the lifting ring 1018 and the movable edge coupling ring 1238 may be removed by the robot arm 1102 and the holder 1104.

As can be appreciated, the actuators can be arranged in the processing chamber or outside of the processing chamber. In some examples, the edge coupling rings may be supplied to the chamber via a cassette, loadlock, transfer chambers and the like. Alternatively, the edge coupling rings may be stored outside of the processing chamber but inside of the substrate processing tool.

Figure 21:
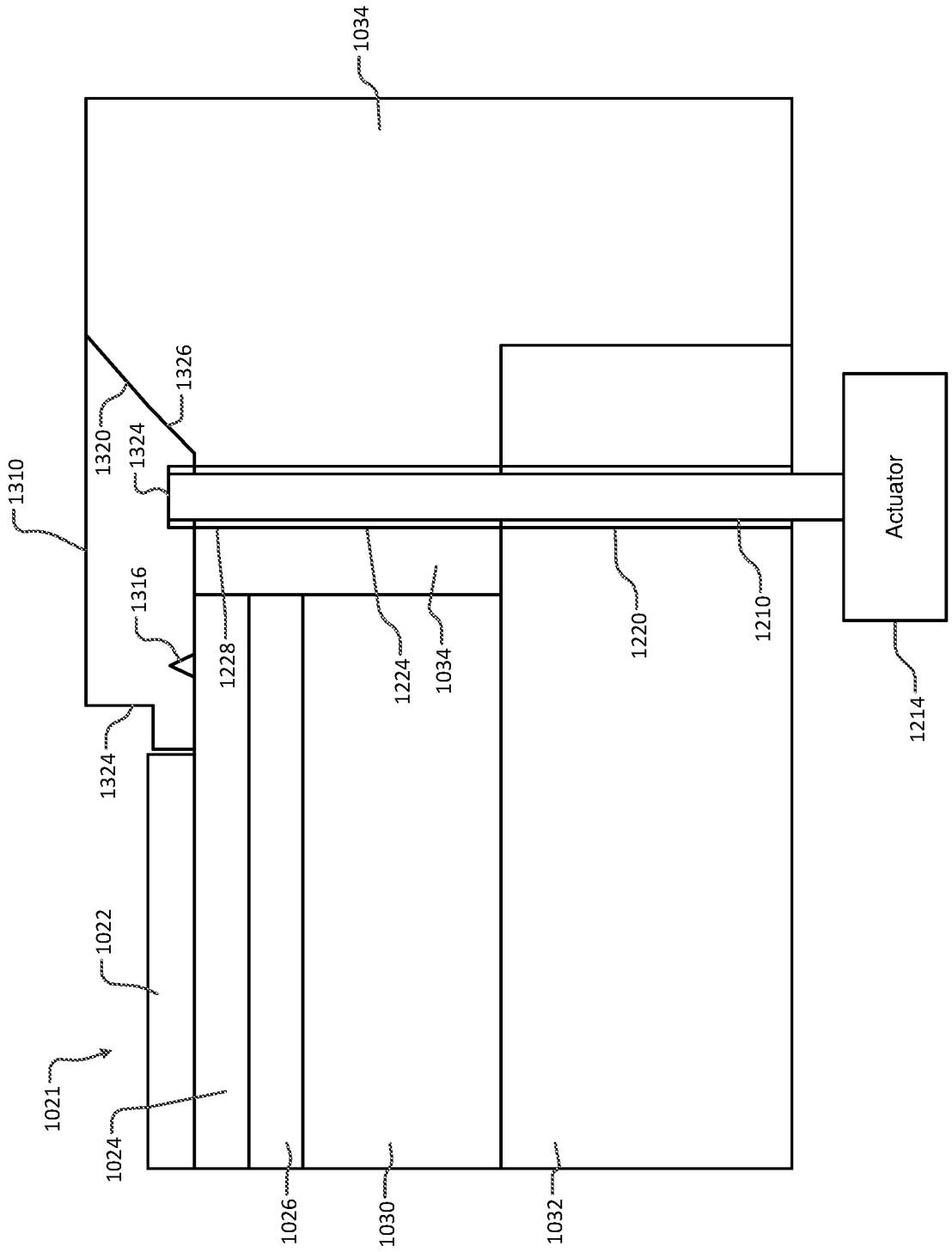
FIG. 21 is a side cross-sectional view of an example of a movable edge coupling ring.
Figure 22:
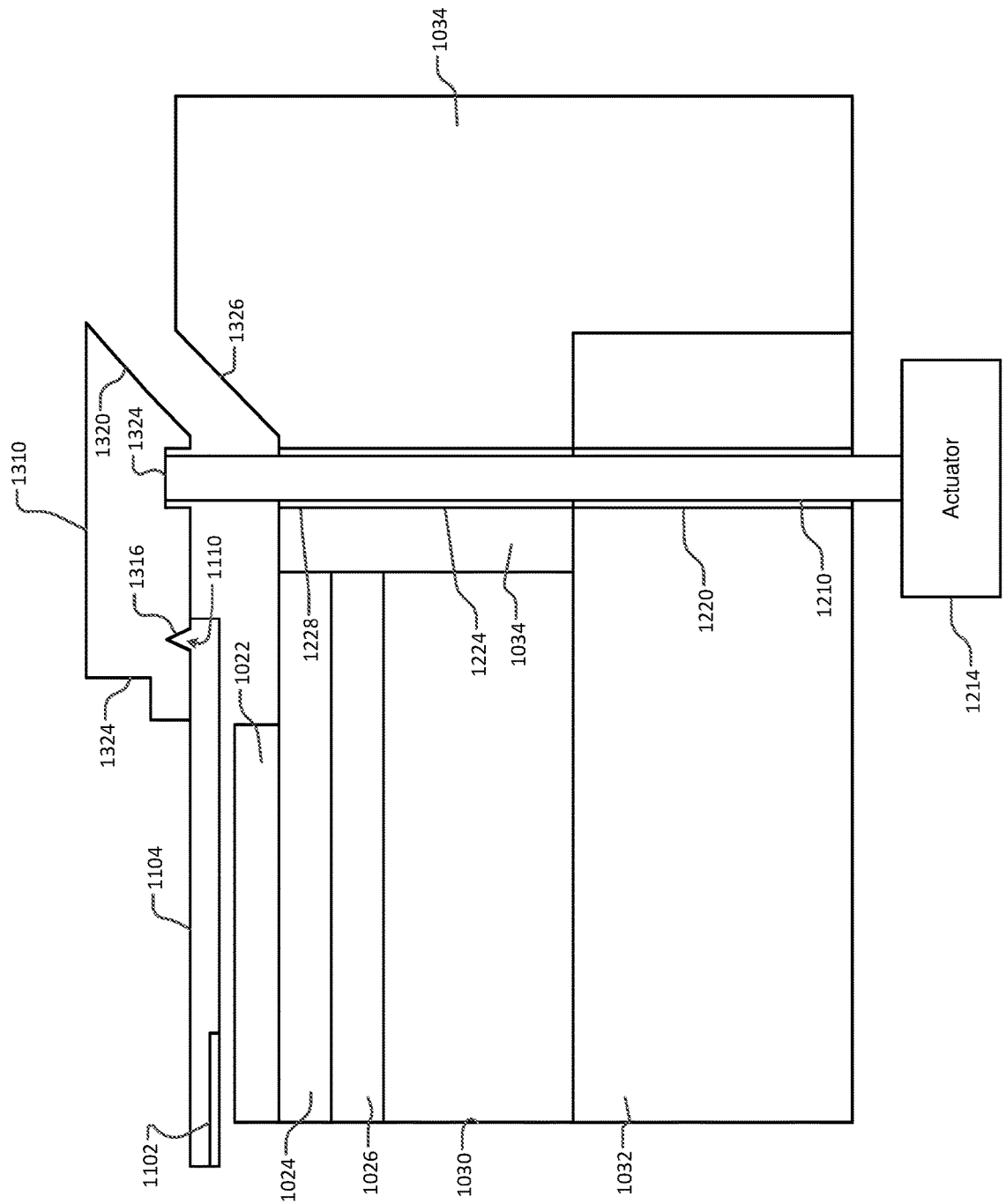
FIG. 22 is a side cross-sectional view of the edge coupling ring of FIG. 21 being lifted by the actuator and removed by a robot arm.

Referring now to FIGS. 21-22, the lifting ring can be omitted in some examples. An edge coupling ring 1310 is arranged on the bottom edge coupling ring 1034 and a radially outer edge of the pedestal. The edge coupling ring 1310 may include one or more self-centering features 1316 and 1320. The edge coupling ring 1310 may further include a groove 1324 for receiving a top surface of the pillar 1210, which is biased by the actuator 1214. The self-centering feature 1320 may be arranged against a corresponding self-centering feature 1326 of the bottom edge coupling ring 1034. In some examples, the self-centering features 1320 and 1326 are inclined planes.

In FIG. 22, the actuator 1214 and the pillar 1210 bias the edge coupling ring 1310 upwardly to remove the edge coupling ring 1310 or to adjust a plasma profile after erosion has occurred. The robot arm 1102 and the holder 1104 can be moved into position below the edge coupling ring 1310. The self-centering feature 1316 may be engaged by the self-centering feature 1110 on the holder 1104 connected to the robot arm 1102. Either the robot arm 1102 moves in an upward direction to provide clearance between the groove 1324 and the pillar 1210 or the pillar 1210 is moved downwardly by the actuator 1214 to provide clearance for the groove 1324.

Figure 23:
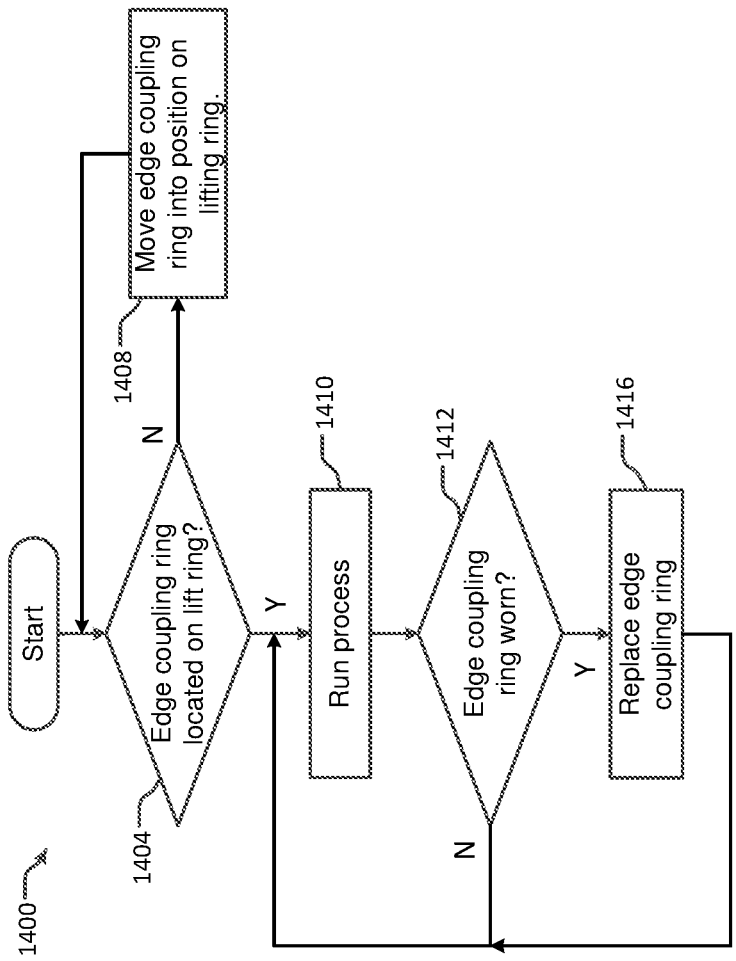
FIG. 23 is an example of a method for replacing an edge coupling ring without opening a processing chamber.

Referring now to FIG. 23, a method 1400 for replacing an edge coupling ring without opening a processing chamber to atmospheric pressure is shown. At 1404, the method determines whether the edge coupling ring is located on the lifting ring. If 1404 is false, the method moves an edge coupling ring into position on the lifting ring using a robot arm at 1408. After the edge coupling ring is located on the lifting ring in the processing chamber, the process is run at 1410. At 1412, the method determines whether the edge coupling ring is worn using any of the criteria described above. If 1412 is false, the method returns to 1410 and the process may be run again. If the edge coupling ring is determined to be worn at 1412, the edge coupling ring is replaced at 1416 and the method continues at 1410.

Figure 24:
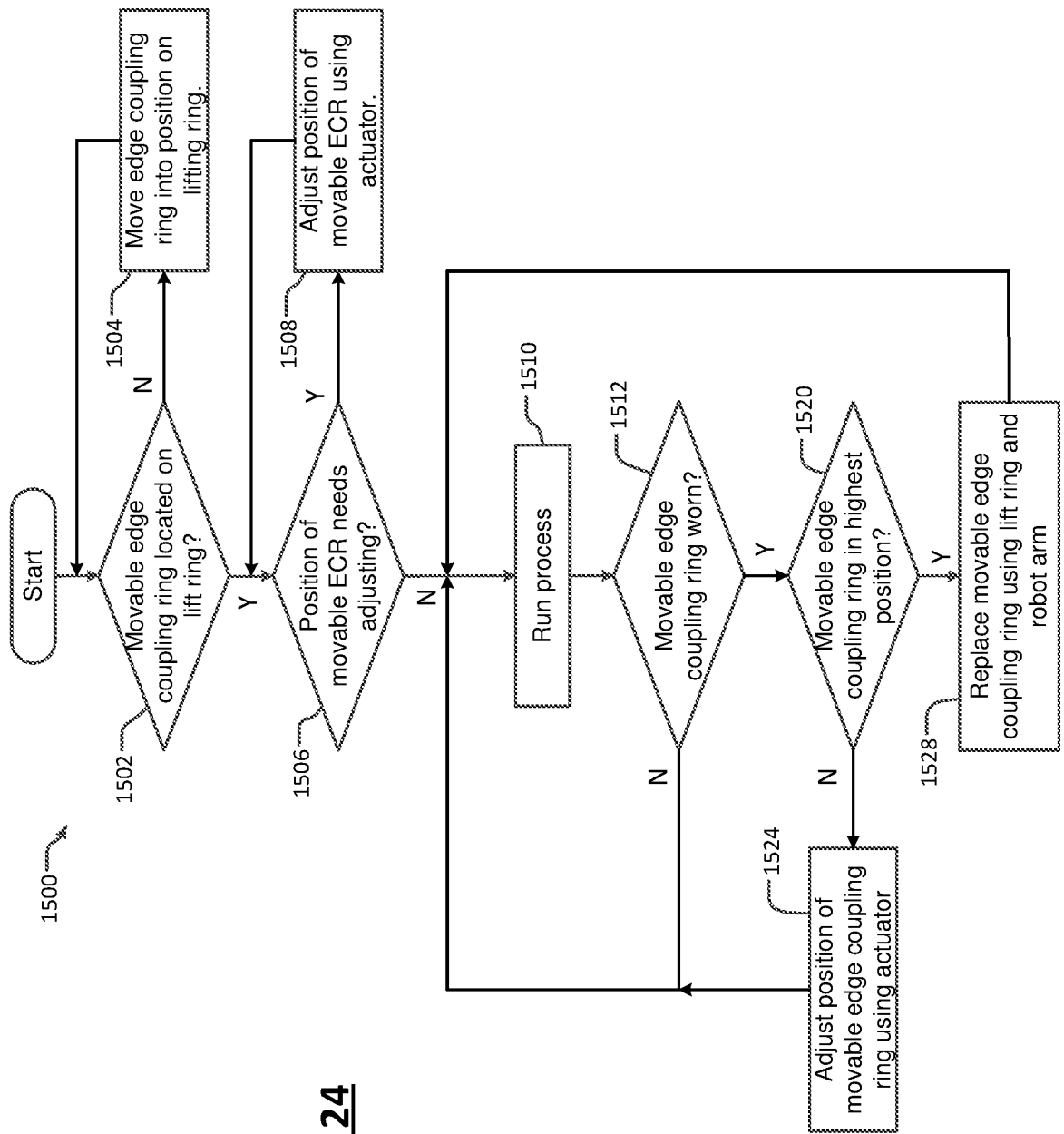
FIG. 24 is an example of a method for moving an edge coupling ring due to erosion and replacing an edge coupling ring without opening a processing chamber.

Referring now to FIG. 24, a method 1500 adjusts a position of the movable edge coupling ring as needed to offset for erosion and selectively replaces the movable edge coupling ring when the movable edge coupling ring is determined to be worn. At 1502, the method determines whether a movable edge coupling ring is located on the lifting ring. If 1502 is false, an edge coupling ring is moved into position on the lifting ring at 1504 and the method continues at 1502.

If 1502 is true, the method determines whether a position of the movable edge coupling ring needs to be adjusted at 1506. If 1506 is true, the method adjusts a position of the movable edge coupling ring using an actuator and returns to 1506. When 1506 is false, the method runs the process at 1510. At 1512, the method determines whether the movable edge coupling ring is worn. If false, the method returns to 1510.

If 1512 is true, the method determines whether the movable edge coupling ring is in a highest (or fully adjusted) position at 1520. If 1520 is false, the method adjusts a position of the movable edge coupling ring using the actuator 1214 at 1524 and the method returns to 1510. If 1520 is true, the method replaces the movable edge coupling ring using the actuator 1064, the lifting ring 1018 and the robot arm 1102.

Figure 25:
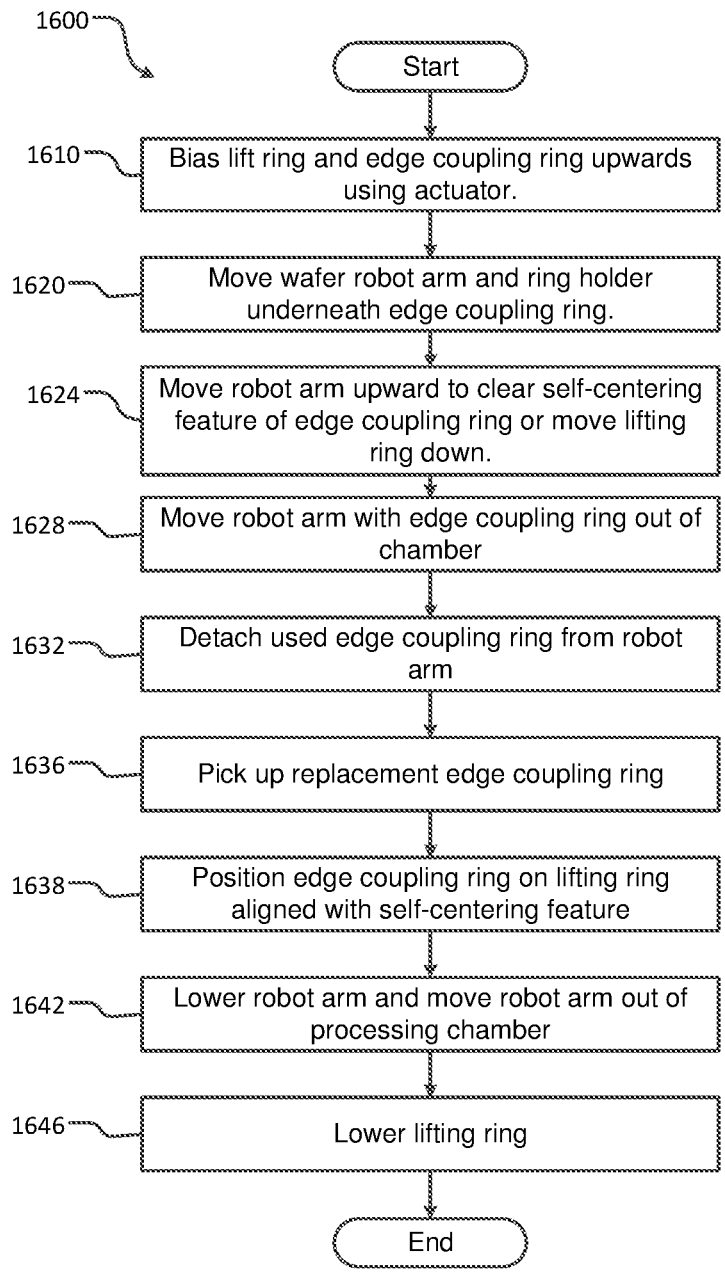
FIG. 25 is an example of a method for raising an edge coupling ring due to erosion and replacing the edge coupling ring without opening a processing chamber.

Referring now to FIG. 25, a method 1600 for replacing the edge coupling ring without opening the process chamber to atmospheric pressure is shown. At 1610, the lifting ring and edge coupling ring are biased upwardly using an actuator. At 1620, the robot arm and the holder are moved underneath the edge coupling ring. At 1624, the robot arm is moved upwardly to clear self-centering features of the edge coupling ring or the lifting ring is moved downwardly. At 1628, the robot arm with the edge coupling ring is moved out of the processing chamber. At 1632, the edge coupling ring is detached from the robot arm. At 1636, a replacement edge coupling ring is picked up by the robot arm. At 1638, the edge coupling ring is positioned on the lifting ring and aligned using one or more self-centering features. At 1642, the robot arm is lowered to allow sufficient clearance for the self-centering feature and the robot arm is removed from the chamber. At 1646, the lifting ring and the edge coupling ring are lowered into position.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a processing chamber;
a pedestal arranged in the processing chamber, the pedestal including an upper plate;
a first ring configured to surround and overlap a radially outer edge of the upper plate of the pedestal arranged in the processing chamber;
a second ring arranged below the first ring, wherein a portion of the first ring overlaps the second ring;
a first actuator configured to actuate a first pillar to selectively move the first ring to a raised position and a lowered position relative to the pedestal; and
a second actuator configured to actuate a second pillar to selectively move the second ring to a raised position and a lowered position relative to the pedestal, wherein,
the first ring includes a first self-centering feature configured to mate with a second self-centering feature of the second ring,
the second ring includes a third self-centering feature configured to mate with a ring other than the first ring, and
at least one of the first self-centering feature, the second self-centering feature and the third self-centering feature is a triangular-shaped self-centering feature.

2. The substrate processing system of claim 1, wherein an outer portion of the first ring overlaps the second ring such that moving the second ring to the raised position moves the first ring to the raised position.

3. The substrate processing system of claim 2, wherein, when the first ring is in the raised position, a bottom surface of the first ring is above an uppermost surface of the pedestal to define a gap between the bottom surface of the first ring and an upper surface of the upper plate.

4. The substrate processing system of claim 3, further comprising a robot arm configured to remove the first ring from the processing chamber when the first ring is in the raised position.

5. The substrate processing system of claim 4, further comprising a holder connected to the robot arm, wherein the holder includes a self-centering feature that mates with a self-centering feature on the first ring.

6. The substrate processing system of claim 1, wherein the second ring is located radially outside of the first ring.

7. The substrate processing system of claim 1, further comprising a third ring arranged below at least part of each of the first ring and the second ring.

8. The substrate processing system of claim 1, wherein the first actuator is configured to move the first ring relative to the second ring to alter an edge coupling profile of the first ring.

9. The substrate processing system of claim 1, wherein the first pillar passes through a baseplate of the pedestal to engage the first ring.

10. The substrate processing system of claim 1, further comprising a controller configured to control the first actuator and the second actuator to selectively move the first ring and the second ring.

11. The substrate processing system of claim 1, wherein the first ring overlaps the second ring at a sloped surface of the first ring which is non-parallel and non-perpendicular with respect to upper surfaces of the first ring and the second ring.

12. The substrate processing system of claim 1, wherein the second ring defines a groove arranged on a bottom-facing surface of the second ring, and the groove is configured to receive the second pillar.

13. A substrate processing system comprising:
a processing chamber;
a pedestal arranged in the processing chamber;
a first ring configured to surround the pedestal arranged in the processing chamber;
a second ring arranged below the first ring, wherein (i) an outer edge of the first ring overlaps an inner edge of the second ring and (ii) an inner edge of the first ring overlaps a radially outer edge of the pedestal but does not overlap the second ring;
a first actuator configured to actuate a first pillar to selectively move the second ring to a raised position and a lowered position relative to the pedestal, wherein the first ring is supported on the second ring such that raising and lowering the second ring raises and lowers the first ring relative to the pedestal; and
a second actuator configured to actuate a second pillar to selectively move the first ring to a raised position and a lowered position relative to the pedestal, wherein,
the first ring includes a first self-centering feature configured to mate with a second self-centering feature of the second ring,
the second ring includes a third self-centering feature configured to mate with a ring other than the first ring, and
at least one of the first self-centering feature, the second self-centering feature and the third self-centering feature is a triangular-shaped self-centering feature.

14. The substrate processing system of claim 13, wherein, when the first ring is in the raised position, a bottom surface of the first ring is above an uppermost surface of the pedestal to define a gap between the bottom surface of the first ring and an upper surface of the uppermost surface.

15. The substrate processing system of claim 14, further comprising a robot arm configured to remove the first ring from the processing chamber when the first ring is in the raised position.

16. The substrate processing system of claim 13, further comprising a third ring arranged below at least part of each of the first ring and the second ring.

17. The substrate processing system of claim 13, wherein the second actuator is configured to actuate the second pillar to selectively move the first ring to a raised position and a lowered position relative to the second ring.

18. The substrate processing system of claim 17, wherein the second actuator is configured to move the first ring relative to the pedestal to alter an edge coupling profile of the first ring.

* * * * *